(12) United States Patent
Chen et al.

(10) Patent No.: US 9,536,541 B2
(45) Date of Patent: Jan. 3, 2017

(54) CONTENT AWARE AUDIO DUCKING

(71) Applicant: Apple Inc., Cupertino, CA (US)

(72) Inventors: David N. Chen, San Jose, CA (US); David E. Conry, El Granada, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/075,007

(22) Filed: Mar. 18, 2016

(65) Prior Publication Data

US 2016/0203830 A1   Jul. 14, 2016

Related U.S. Application Data

(62) Division of application No. 14/058,011, filed on Oct. 18, 2013, now Pat. No. 9,300,268.

(51) Int. Cl.
| | | |
|---|---|---|
| G10L 21/00 | (2013.01) | |
| H03G 7/00 | (2006.01) | |
| G10L 21/0356 | (2013.01) | |
| G06F 3/16 | (2006.01) | |
| G10L 25/45 | (2013.01) | |

(52) U.S. Cl.
CPC .......... *G10L 21/0356* (2013.01); *G06F 3/162* (2013.01); *G10L 25/45* (2013.01); *H03G 7/002* (2013.01); *H03G 7/007* (2013.01)

(58) Field of Classification Search
None
See application file for complete search history.

(56) References Cited

U.S. PATENT DOCUMENTS

| | | | | |
|---|---|---|---|---|
| 8,326,444 B1* | 12/2012 | Classen | ............... | H03G 3/3005 381/106 |
| 2007/0121966 A1* | 5/2007 | Plastina | ................ | H03G 7/007 381/104 |
| 2008/0080721 A1* | 4/2008 | Reid | ................... | G06F 3/04847 381/104 |
| 2008/0130918 A1* | 6/2008 | Kimijima | ............... | H04S 1/007 381/107 |
| 2010/0198375 A1* | 8/2010 | Rottler | ................. | G06F 3/0482 700/94 |
| 2010/0280638 A1* | 11/2010 | Matsuda | ................ | G06F 3/165 700/94 |
| 2012/0039489 A1* | 2/2012 | Chen | ....................... | H03G 3/32 381/107 |
| 2013/0230193 A1* | 9/2013 | You | ......................... | G06F 3/017 381/109 |
| 2014/0328500 A1* | 11/2014 | Patwardhan | ............ | H03G 5/16 381/107 |
| 2015/0046824 A1* | 2/2015 | Humphrey | ........... | G06F 3/0481 715/727 |

* cited by examiner

*Primary Examiner* — Thang Tran
(74) *Attorney, Agent, or Firm* — Adeli LLP

(57) ABSTRACT

A novel audio ducking method that is aware of the loudness levels of the audio content is provided. The method specifies a minimum loudness separation between audio tracks that are designated as masters and audio tracks that are designated as slaves. The method attenuates the volume of the slave tracks in order to provide at least the minimum loudness separation between the slave tracks and the master tracks. The amount of attenuation for a slave is determined based on the loudness levels of the slave and of a master.

20 Claims, 21 Drawing Sheets

CONTENT AWARE AUDIO DUCKING

CLAIM OF BENEFIT TO PRIOR APPLICATIONS

This Application is a divisional application of U.S. patent application Ser. No. 14/058,011, filed Oct. 18, 2013, now published as U.S. Patent Publication 2015/0110294, which is incorporated herein by reference.

BACKGROUND

Ducking is an audio effect commonly used for mixing multiple different types of sounds from multiple sources. In ducking, the level of one audio signal is reduced by the presence of another signal. This is typically achieved by lowering or "ducking" the volume of a secondary (slave) audio track when the primary (master) track starts, and lifting the volume again when the primary track is finished. An example use of this effect is for creating a voice-over by a professional speaker reading the translation of a foreign language original dialogue. Ducking becomes active as soon as the translation starts. The ducking effect can also be applied in more sophisticated ways, where a signal's volume is delicately lowered by another signal's presence. One track is made quieter (the ducked track, or the slave) so another track (the ducking track, or the master) can be heard.

Most audio systems perform audio ducking by attenuating the volume of the slave track without considering how loud the slave track already is. This is problematic when the slave is either too quiet or too loud in relation to the master. For a slave that is already too quiet, lowering its volume may make the slave nearly or completely inaudible. On the other hand, lowering the volume of a slave that is far too loud may not be enough to bring the slave's volume down to a desired level in relation to the master.

A common way to perform machine/software assisted ducking is to use an audio compressor to attenuate the volume of the slaves. The user sets a threshold level above which the compressor starts attenuating the incoming signal. Once the incoming signal falls below that threshold the attenuation is removed. How quickly the compressor reacts to a signal rising above the threshold and how quickly it returns to the original signal's level once it falls below the threshold is determined by "attack" and "release" controls. Adjusting these controls requires manual intervention that can be quite difficult to master, and is very signal dependent. For example, quick transients in the signal that briefly rise above the threshold might trigger the attenuation even though their duration is such that they aren't actually perceived as loud to human ears. A user of such an audio system therefore must painstakingly tweak the audio ducking parameters in order to arrive at desired loudness levels for the master and the slave.

What is needed is an audio system that intelligently ducks the loudness of each slave when performing audio ducking operations. Such a system should not be affected by short term transients in audio signals, and should attenuate audio signals based on perceptible differences in loudness to human ears rather than on imperceptible changes in audio volumes.

SUMMARY

In order to provide an audio system that intelligently ducks the overall volume of slave tracks when performing audio ducking operations, some embodiments provides a content-aware audio ducking method that specifies a minimum loudness separation between master tracks and slave tracks. The method attenuates the volume of the slave tracks in order to provide at least the minimum loudness separation between the slave tracks and the master tracks. The amount of attenuation for a slave is determined based on the loudness levels of the slave and of a master.

Some embodiments perform ducking on a window-by-window basis. The slave's audio that falls within each window is attenuated by an amount that is determined by a worst case differential between the slave's loudness and the master's loudness within that window. Some embodiments produce a momentary loudness curve for each track and determine the worst case differential for each window from the momentary loudness curve. In order to minimize the effect of outlier samples in the audio ducking operation, some embodiments introduce an upper bound for the differentials between the masters and the slaves based on their respective program loudness levels. When a master's loudness level drops below a certain threshold silence level, some embodiments keep the slaves' loudness at a same level as before the master has become silent.

Some embodiments specify and apply different loudness separation for different slaves. In some embodiments, the audio ducking operation specifies different loudness separation between different pairing of audio tracks or media clips. In some embodiments, the audio ducking operation is performed by a media editing application running on a computing device. The media editing application supports audio ducking by designating one or more audio tracks as masters and one or more audio tracks as slaves. The media editing application also provides the specification for the minimum separation between the loudness of each master and of each slave.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Figure 1:
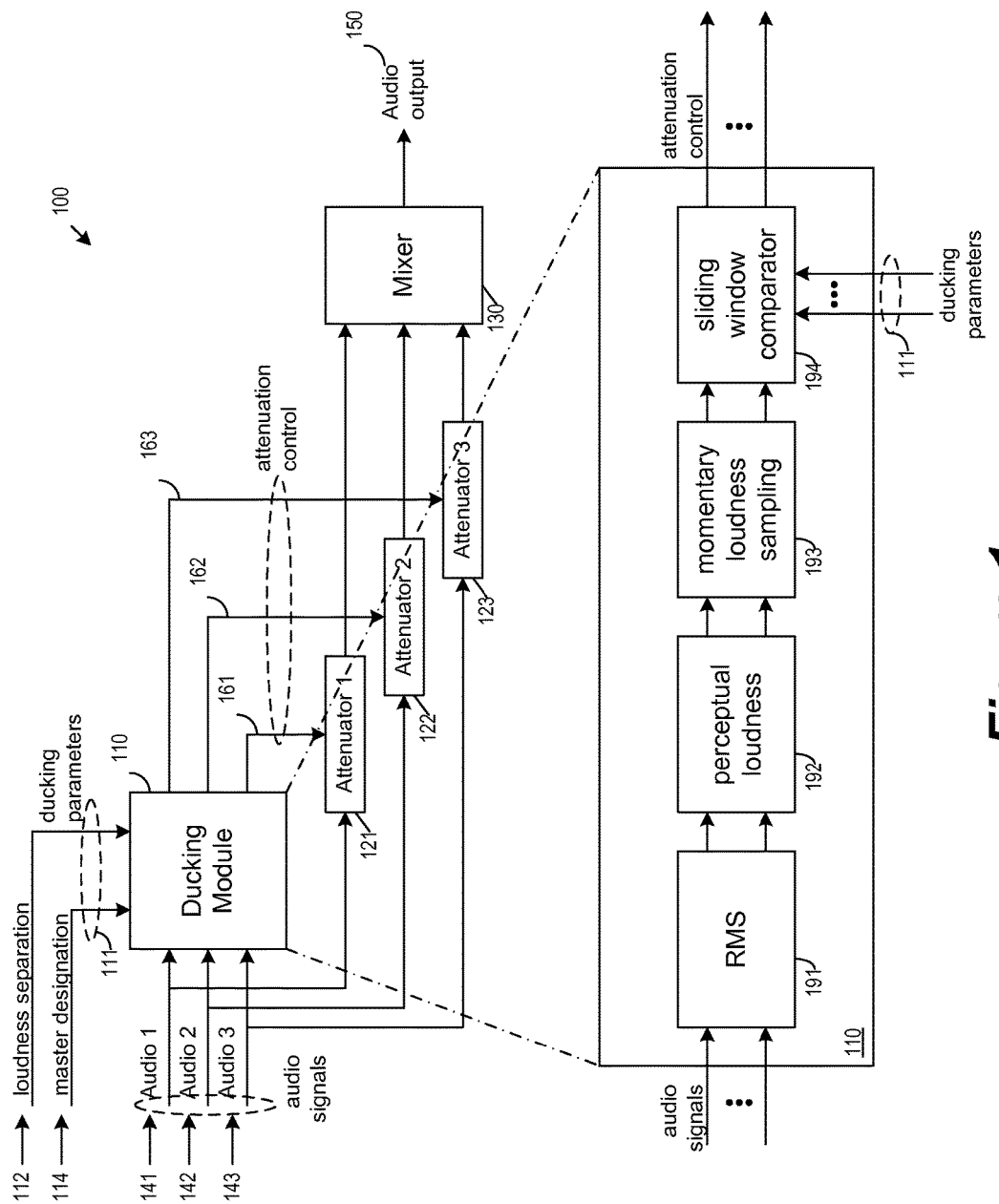
FIG. 1 illustrates an audio system that performs audio ducking operations.

In the following description, numerous details are set forth for the purpose of explanation. However, one of ordinary skill in the art will realize that the invention may be practiced without the use of these specific details. In other instances, well-known structures and devices are shown in block diagram form in order not to obscure the description of the invention with unnecessary detail.

In order to provide an audio system that intelligently ducks the overall volume of slave tracks when performing audio ducking operations, some embodiments provides a content-aware audio ducking method that specifies a minimum loudness separation between master tracks and slave tracks. The method attenuates the volume of the slave tracks in order to provide at least the minimum loudness separation between the slave tracks and the master tracks. The amount of attenuation for a slave is determined based on the loudness levels of the slave and of a master.

In some embodiments, in order to ensure that the audio ducking is based on perceptible change in loudness to human ears rather than on imperceptible transient changes in audio volume or sound pressure levels, the audio system makes window by window comparisons in momentary loudness values between the masters and the slaves. The audio system then attenuates the volume of each slave by an amount determined from the window by window comparison in order to ensure that the loudness of the slave fulfills the required minimum separation from the loudness of the masters.

Several more detailed embodiments of the invention are described below. Section I describes an audio system that performs audio ducking based on the loudness of the audio content. Section II describes the window-by-window content-aware audio ducking operations. Section III discusses the specification of parameters for audio ducking operations. Section IV provides a software architecture for a media editing application that implements audio ducking. Section V describes a media editing application and its graphical user interface for some embodiments of the invention. Section VI describes an electronic system with which some embodiments of the invention are implemented.

I. Audio Ducking Based on the Loudness of Audio Content

In some embodiments, the content-aware audio ducking operation for a given set of audio tracks is based on the loudness levels of the audio tracks rather than on their volume. Specifically, some embodiments attenuate the volume of the slave tracks in order to provide a minimum separation between the loudness of the masters and the loudness of the slaves. In some embodiments, using differences in loudness to determine attenuation ensures that only perceptible changes in loudness of audio content affects the audio ducking rather than imperceptible transient changes in sound pressure levels.

In some embodiments, "loudness" is defined as an attribute of auditory sensation in terms of which sounds can be ordered on a scale extending from quiet to loud. In other words, loudness is a subjective measure of the strength or the power of sound that is based on human auditory perception. This is in contrast with "volume", which in some embodiments is used to denote an objective measure of the strength or energy of sound such as sound pressure level (SPL). Rather than performing audio ducking based solely on the volume of the master, some embodiments perform audio ducking by determining and comparing the loudness of the masters and of the slaves.

FIG. 1 illustrates an audio system 100 that performs audio ducking operations according to some embodiments of the invention. Specifically, the audio system 100 performs audio ducking by examining the loudness of the incoming audio signals. By comparing the loudness of the master tracks with the loudness of the slave tracks, the audio system 100 attenuates the volume of slave tracks to provide a minimum separation between the loudness of the slave tracks from the loudness of the master tracks.

In some embodiments, the audio system 100 is a computing device that plays back sound by mixing multiple tracks or clips of audio. Such a playback device can be a stand-alone player or a computing device running a media player program. In some embodiments, the audio system 100 is implemented by a media editing application running on the computing device. The media editing application supports audio ducking by designating one or more audio tracks as masters and one or more audio tracks as slaves. The media editing application also provides the specification for the minimum separation in loudness between masters and slaves. In some embodiments, the ducking operation is one of several media editing operations employed to create a composite multi-media presentation.

As illustrated the audio system 100 includes a ducking module 110, several audio attenuators 121-123, and an audio mixer 130. The audio system 100 receives several audio tracks 141-143 and produces a mixed audio output 150. The audio system 100 also receives a set of ducking parameters 111.

The audio tracks 141-143 are streams of audio content that are the subject of the ducking operation. In some embodiments, the audio tracks are received from a live audio source (such as a microphone), and the audio ducking operation is part of a real-time operation that creates a mixed audio output for a live speaker or for storage. In some embodiments, the audio tracks are media clips retrieved from a storage device by a media editing application. These clips can be audio clips with only audio content (such as MP3, WAV, or other audio formats). These clips can also be video clips with audio content (such as MP4, WMA, or MOV or other video format).

The ducking parameters 111 includes a master designation parameter 114 and a required loudness separation parameter 112. The master designation parameter 114 provides the designation that specifies which of the audio tracks 141-143 is a master of the audio ducking operation. In some embodiments, only one track is designated as master while the other tracks are slaves. Some embodiments allow multiple tracks to be designated as masters. The loudness separation parameter 112 specifies the required separation in loudness between tracks that are designated as masters and tracks that are designated as slaves. In some embodiments that implement the audio system 100 as part of a media editing application, the ducking parameters 111 are provided by the user through a user interface and/or retrieved from a storage device as part of a media project being edited by the media editing application.

The ducking module 110 performs audio ducking operation on audio tracks 141-143 based on the ducking parameters 111, which includes the loudness separation parameter 112 and the master designation parameter 114. The parameter 114 informs the ducking module which audio tracks are designated as masters of the ducking operation. The parameter 112 informs the ducking module how much separation in loudness it must provide between the masters and the slaves. Based on the ducking parameters 111, the ducking module 110 generates the attenuation controls 161-163 to the attenuators 121-123. For example, if the master designation 114 designates the audio track 141 as a master, the ducking module 110 would use the attenuation control 162-163 to attenuate/duck the audio tracks 142-143 as slaves by amounts that are computed according to the specified minimum loudness separation 112. In some embodiments, the ducking parameters 111 cause the ducking module 110 to boost the volume by generating control signals that amplify some or all of the audio tracks 141-143.

The ducking module 110 analyzes the content of the incoming audio tracks 141-143 and generates a set of attenuation control signals 161-163 to the attenuators 121-123. Specifically, the ducking module 110 generates the attenuation control signal for each slave audio track based on the amount of attenuation that is required for that slave track. To provide the requisite separation between a master track and a slave track, the ducking module 110 determines the needed attenuation based on the loudness of the master track, the loudness of the slave track, and the required loudness separation parameter 112. In other words, the ducking operation performed by the ducking module 110 is a content aware audio ducking operation based on the content of audio tracks.

The attenuators 121-123 set the volumes of the audio tracks 141-143 based on a set of attenuation control signals 161-163. The control signals 161-163 are provided by the ducking module 110, which produces the attenuation control signals by performing audio ducking operations on the audio tracks 141-143. Each attenuator is controlled by its own set of control signal (e.g., attenuator 121 is controlled by signal 161) such that different attenuators can apply different amount of attenuation (or amplification) to its corresponding audio signal. As attenuation control signals 161-163 change according to the content of the audio tracks, the amount of attenuation applied by the attenuators 121-123 to the audio tracks 141-143 also changes accordingly. In some embodiments, the attenuation control signal is updated several times a second (e.g., 10 times a second). In some embodiments, the attenuation control signal is updated even more frequently, such as once every audio sample.

In some embodiments, the attenuators are also amplifiers, and the control signals 161-163 supplied by the ducking module 110 can cause each attenuator to amplify as well as to attenuate. The attenuated (or amplified) audio tracks are sent to the mixer 130, which produces a mixed audio output 150. In some embodiments, the audio tracks 141-143 are digital signals, and that the attenuators 121-123 and the mixer 130 include digital processing modules for digitally mixing and altering the volumes of the audio tracks. In some embodiments, the attenuators and mixers are analog circuits that receive the audio signals in analog form and perform attenuation and mixing in analog domain. Some embodiments do not include a mixer and the attenuated signals are directly output to a set of speakers or to a storage device.

FIG. 1 also illustrates a block diagram for the ducking module 110 for some embodiments. As illustrated, the ducking module 110 includes a root mean square (RMS) module 191, a perceptual loudness module 192, a momentary loudness sampling module 193, and a sliding window comparator module 194. The audio signals 141-143 enter the RMS module 191, which calculates the sound pressure level (SPL) or the volume of the incoming audio signals. The perceptual loudness module 192 then converts the SPLs of the audio signals into their respective perceptual loudness levels, which are in turn sampled by the momentary loudness sampling module 193 to produce momentary loudness samples. The sliding window comparator 194 then performs window by window comparison of the momentary loudness samples between the different tracks and produces the attenuation control signals for the attenuators 121-123.

The RMS module 191 is a time-averaging module for computing the volumes or the SPLs of the incoming audio signals. The incoming audio signals are typically oscillatory signals representing instantaneous sound pressure sampled at relatively high frequency (e.g., in kHz range). In order to convert the oscillatory signals into useful volume or SPL measures of the audio content, some embodiments perform time-averaging operations such as RMS calculations on the instantaneous sound pressure samples over a certain interval of time. The time-averaged values are then converted into SPL measures in units of decibels, or dBSPL. In some embodiments, the time-averaging of the audio signals is not performed in a distinct RMS module, but rather as part of the perceptual loudness conversion operation.

The perceptual loudness module 192 converts the objective SPL measures of the audio signals into their respective subjective loudness. In some embodiments, the SPLs of the audio signals are mapped to their respective loudness levels according to equal-loudness contours (e.g., Q-curves) of human's hearing sensitivity as specified by certain audio standards (such as ISO 226:2003), which provides mapping from SPL to loudness across different frequencies. In some embodiments, the equal-loudness contours are used to map the volume of the incoming signals in dBSPL into the perceived loudness level in "phons", one "phon" being defined to equal to one dBSPL. Consequently, in some embodiments, a difference in loudness is also expressed in decibels as in volume or SPL.

The momentary loudness sampling module 193 samples the loudness provided by the perceptual loudness module 192. The human auditory system averages the effects of SPL over a 600-1000 ms interval. A sound of constant SPL is perceived to increase in loudness as its duration becomes longer. The perception of loudness stabilizes after about one second after which point the sound will not be perceived as becoming louder. For sounds of duration greater than one second, the moment-by-moment perception of loudness is related to the average loudness during the preceding 600-1000 ms. In order to account for the effects of SPL duration on human loudness perception, the momentary loudness sampling module 193 in some embodiments generates momentary loudness samples several times a second (e.g., once every 100 ms) by averaging loudness data in overlapping intervals (e.g., from previous 400 ms). The generated momentary loudness samples are in turn provided to the sliding window comparator module 194.

The sliding window comparator module 194 performs window by window comparison on the momentary loudness samples for the different audio tracks. It uses the master designation parameter 114 to designate the master tracks of the ducking operation. The sliding window comparator module 194 then calculates, on a window by window basis, the attenuation values that are needed for the slave tracks to comply with the requirements specified by the loudness separation parameters 112. The attenuation values are used to control the attenuators 161-163, which set the volume of the audio signals. The window by window audio ducking operation will be further described in Section II below. Since loudness is a function of SPL, attenuating an audio signal effectively reduces/attenuates both its volume and its loudness. In some embodiments, when the ducking operation requires reduction or attenuation of loudness of a particular slave track, the ducking module 110 would use a corresponding attenuator to reduce the volume or SPL of the particular slave track.

In some embodiments, the ducking module 110 implements a perceptual-based loudness algorithm based on a standard such as ITU-R BS.1770-3. A ducking module that implements such a standard in some embodiments generates the momentary loudness samples from the received audio signals in the following stages: (1) K-frequency weighting; (2) mean square calculation for each channel of audio signals; (3) channel-weighted summation; and (4) gating of blocks of samples over an interval of time. In some embodiments, the gating stage (4) creates overlapping blocks of data (400 ms with 75% overlap, with a first threshold at −70 LKFS and a second threshold at −10 dB relative to the level measured after application of the first threshold.) The algorithm in turn outputs a momentary loudness value every 100 ms representing the computed loudness value for the last 400 ms's worth of data (i.e. 75% overlap). In some of these embodiments, the time averaging of incoming audio signals is performed as part of the perceptual loudness algorithm that follows a filtering stage, and the ducking module 110 would not have an upfront RMS module such as 191.

II. Window-by-Window Audio Ducking Operations

As mentioned, in order to ensure that the reduction in loudness is based on perceptible change in loudness to human listening rather than on imperceptible transient changes in audio volume or sound pressure levels, some embodiments perform audio ducking on a window-by-window basis. In some embodiments, each slave's audio that falls within a window is attenuated by an amount that is determined by a worst case differential between the slave's loudness and the masters' loudness within that window. Some embodiments produce a momentary loudness curve for each track and determine the worst case differential for each window from the momentary loudness curve. In order to minimize the effect of outlier samples in the audio ducking operation, some embodiments introduce an upper bound for the differentials between the masters and the slaves based on their respective program loudness levels. When a master's loudness level drops below a certain threshold silence level, some embodiments keep the slaves' loudness at a same level as before the master has become silent.

Figure 2:
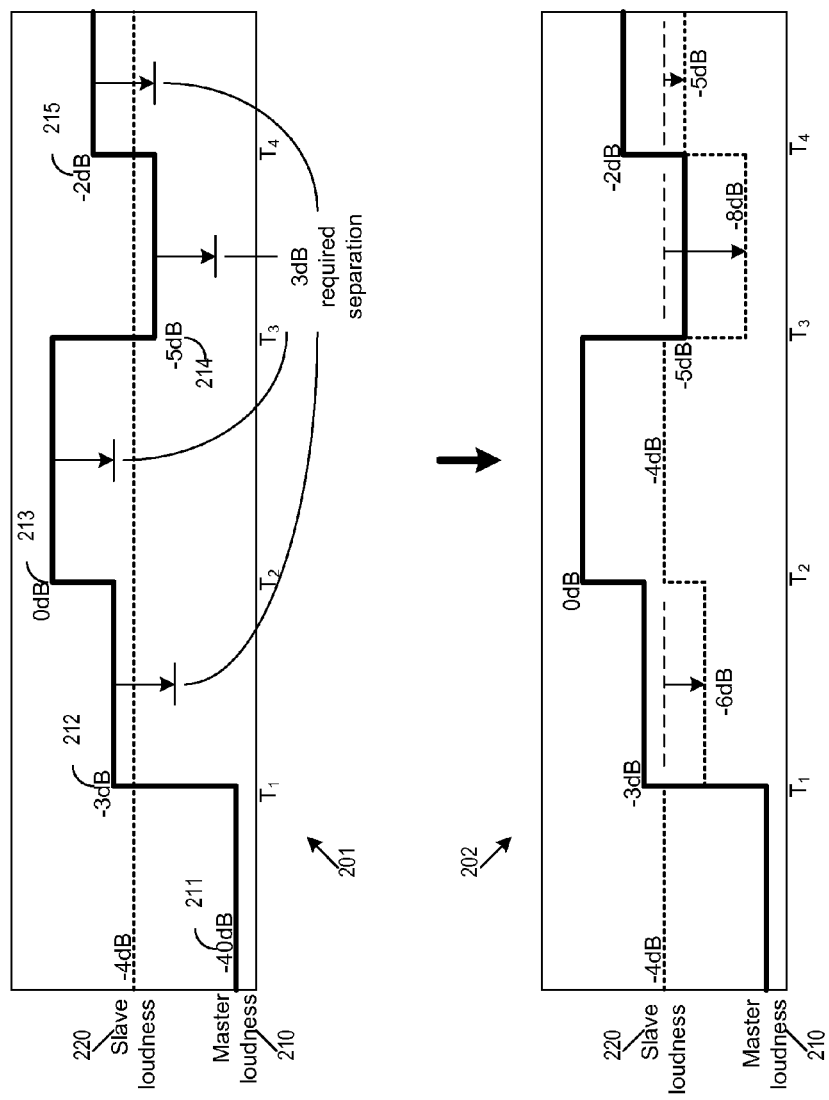
FIG. 2 illustrates a content aware ducking operation for a master audio and a slave audio.

FIG. 2 illustrates a content aware ducking operation for a master audio and a slave audio. As illustrated, an audio track 210 is designated as the master track of the ducking operation and an audio track 220 is designated as the slave track of the ducking operation. In other words, the loudness of the slave track 220 may be reduced in favor of the master track 210. The reduction in loudness of the slave is to guarantee a minimal separation from the loudness of the master. Since the minimum separation in this example is 3 decibels (3 dB), the ducking operation reduces the loudness of the slave to be always at least 3 dB below the loudness of the master, as long as the master track is not silent.

The content aware ducking operation is illustrated in two stages 201 and 202. Stage 201 shows the master track 210 and the slave track 220 before the ducking operation. The master track 210 is at several different loudness levels. Specifically, the master track is at −40 dB before time $T_1$, at −3 dB between times $T_1$ and $T_2$, at 0 dB between times $T_2$ and $T_3$, at −5 dB between times $T_3$ and $T_4$, and at −2 dB after $T_4$. The loudness of the slave track 220 is at a constant level −4 dB from before $T_1$ till after $T_4$. The audio system treats the master audio as being silent or absent prior to $T_1$ (because the master's loudness level of −40 dB before $T_1$ is below a floor level). The level of the slave's loudness in FIG. 2 is held to be constant for purpose of illustrative simplicity. The content aware audio ducking operation described in FIG. 2 is also applicable to slave tracks with variable loudness levels.

Different embodiments define audio silence for the master audio track (or any audio track) differently. Some embodiments consider master audio as being silent only when the audio system detects a complete absence of audio signal in the master track (e.g., there is no digital signal). In some embodiments, the master track is considered to be silent when its loudness level has fallen below a certain threshold or floor level. In some embodiments, such a threshold is set in relation to an average loudness level (e.g., the program loudness) of the entire audio presentation or of a particular audio track. In some embodiments, such a threshold is predetermined by the audio system or by the media editing application that implements the audio system.

The stage 201 also shows the required separation between the master and the slave for the content aware ducking operation. In the example audio ducking operation of FIG. 2, the slave's loudness is required to be at least 3 dB below the master's loudness when the master audio track is present. The master audio is present after $T_1$, and the slave's loudness level will be changed to leave at least 3 dB of separation between itself and the master's loudness after $T_1$. However, the master audio is absent before $T_1$, and therefore the slave's loudness level need not be changed prior to $T_1$.

Stage 202 shows the result of the content aware audio ducking operation. As illustrated, the slave loudness remain at −4 dB before $T_1$, because the master is silent before $T_1$. The audio system reduces the slave's loudness from −4 dB to −6 dB between $T_1$ and $T_2$ to provide 3 dB separation from the master's loudness of −3 dB. The audio system attenuates the slave's loudness from −4 dB to −8 dB between $T_3$ and $T_4$ to provide 3 dB separation from the master's loudness of −5 dB. The audio system has also attenuated the slave's loudness from −4 dB to −5 dB after $T_4$ to provide 3 dB separation from the master's loudness of −2 dB.

Some embodiments do not attenuate the slave when there is already a sufficient separation between the master's loudness and the slave's loudness. In this example, the master's loudness is at 0 dB between $T_2$ and $T_3$, which is already more than 3 dB louder than the slave's loudness of −4 dB.

Consequently, the audio ducking operation does not attenuate the slave between $T_2$ and $T_3$, and the slave's loudness remains at −4 dB during this interval.

Figure 3:
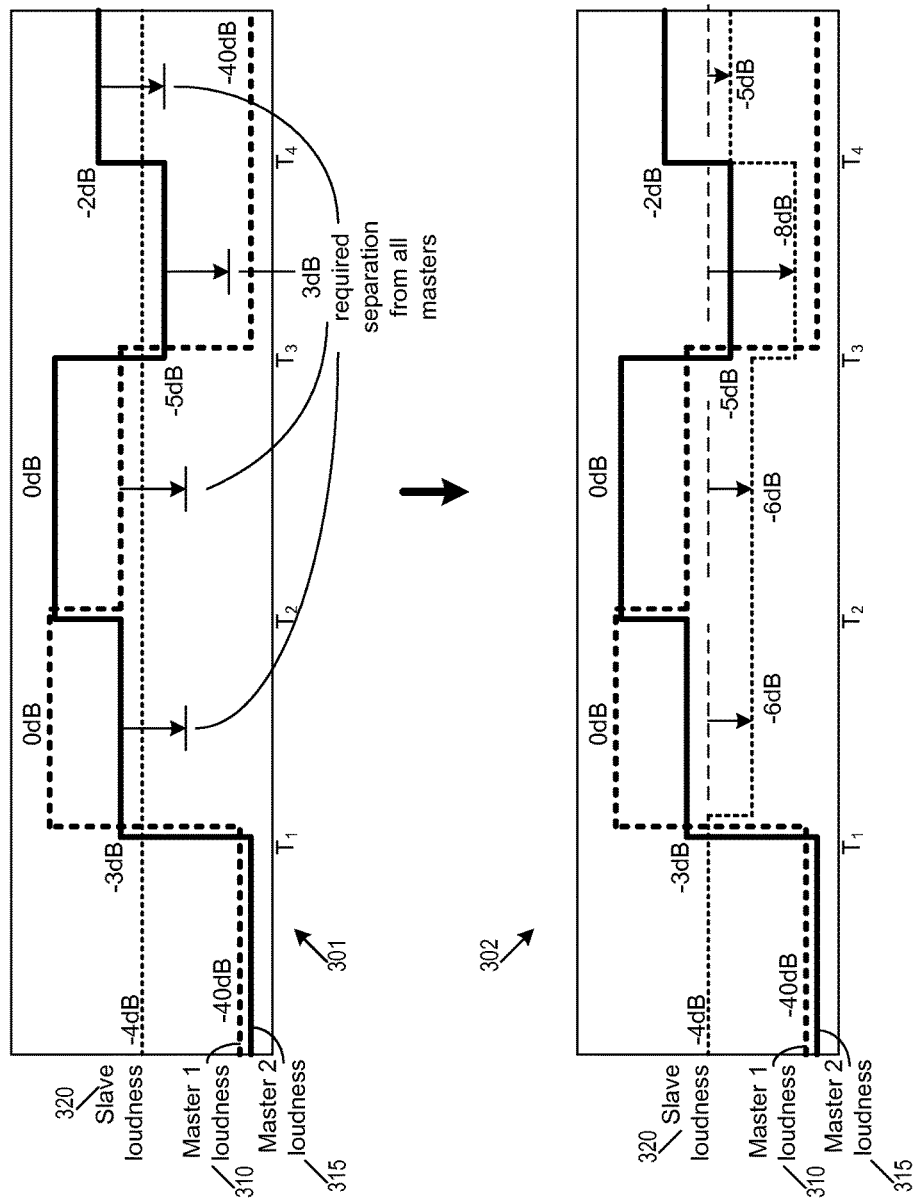
FIG. 3 illustrates a content aware ducking operation with multiple audio ducking masters.

As mentioned, some embodiments allow multiple audio tracks to be designated as masters of the audio ducking operation. FIG. 3 illustrates a content aware ducking operation with multiple audio ducking masters for some embodiments. As illustrated, audio tracks 310 and 315 are designated as the masters and an audio track 320 is designated as the slave of the ducking operation. Similar to the slave audio track 220 of FIG. 2, the loudness of the audio track 320 will be reduced by the audio ducking operation. However, the loudness of the slave track 320 is reduced in favor of two master tracks 310 and 315. Namely, the loudness of the slave 320 is reduced in order to satisfy the minimum loudness separation requirement from both masters 310 and 315. Since the required minimum separation in this example is 3 dB for both masters, the ducking operation reduces the loudness of the slave to be at least 3 dB below the loudness of the quieter master (as long as the quieter master is not silent). In some embodiments, different master can have different minimum separation requirements, and each slave is attenuated so to satisfy the minimum loudness separation requirement of each master (if not silent).

The content aware ducking operation with multiple masters is illustrated in two stages 301 and 302. Stage 301 shows the master track 310 and the slave track 320 before the ducking operation. The first master track 310 is at −40 dB before time $T_1$, at −3 dB between times $T_1$ and $T_2$, at 0 dB between times $T_2$ and $T_3$, at −5 dB between times $T_3$ and $T_4$, and at −2 dB after $T_4$. The second master track 315 is at −40 dB before $T_1$, at 0 dB between times $T_1$ and $T_2$, at −3 dB between times $T_2$ and $T_3$, and at −40 dB after $T_4$. The loudness of the slave track 320 is originally at a constant level −4 dB from before $T_1$ till after $T_4$. The audio system treats both master tracks 310 and 315 as being silent before $T_1$ and the second master track 315 as being silent after $T_3$ (because the loudness level −40 dB is below floor level).

Stage 302 shows the result of the content aware audio ducking operation with respect to the master tracks 310 and 315. As illustrated, the slave loudness remain at −4 dB before $T_1$, because both master tracks are silent before $T_1$. The audio system attenuates the slave's loudness from −4 dB to −6 dB between $T_1$ and $T_2$ to provide 3 dB separation from the first master 310 (loudness −3 dB). Though the second master 315 is at 0 dB loudness between $T_1$ and $T_2$, the audio system still ducks the slave audio with respect to the first master 310. This is because the loudness level of the first master 310 is lower than that of the second master 315 during the time interval, and by satisfying the minimum separation requirement of the quieter master (310), the minimum separation requirement for the louder master (315) is also satisfied.

After $T_2$ and before $T_3$, the loudness of the second master 315 drops to −3 dB, while the loudness of the first master 310 rises to 0 dB. Though the loudness level of the first master 310 has risen, the audio system continues to attenuate the slave's loudness to −6 dB. This is because the loudness level of the second master 315 has fallen below that of the first master 310, and the slave's loudness must be attenuated to provide the 3 dB minimum separation from the −3 dB loudness of the second master 315.

After the time $T_3$, the loudness of the second master 315 falls below the floor level, but the first master 310 remains active. The audio system therefore continues to attenuate the slave audio 320 in order to maintain the 3 dB minimum separation from the first master 310, first to −8 dB before $T_4$ (because the first master is at −5 dB) and then to −5 dB after $T_4$ (because the first master is at −2 dB).

For purpose of illustrative clarity and simplicity, some of the figures below show only one master and one slave. However, one of ordinary skill would realize that the embodiments of the invention described by reference to those figures apply to audio systems with multiple slaves and/or multiple masters as well.

In some embodiments, the content aware audio ducking operation is performed on a window-by-window basis. Some embodiments identify a worst case differential between the slave's loudness and the master's loudness within each window. The identified worst case differential is then used to determine the amount of attenuation needed for the slave's audio within that window.

Figure 4:
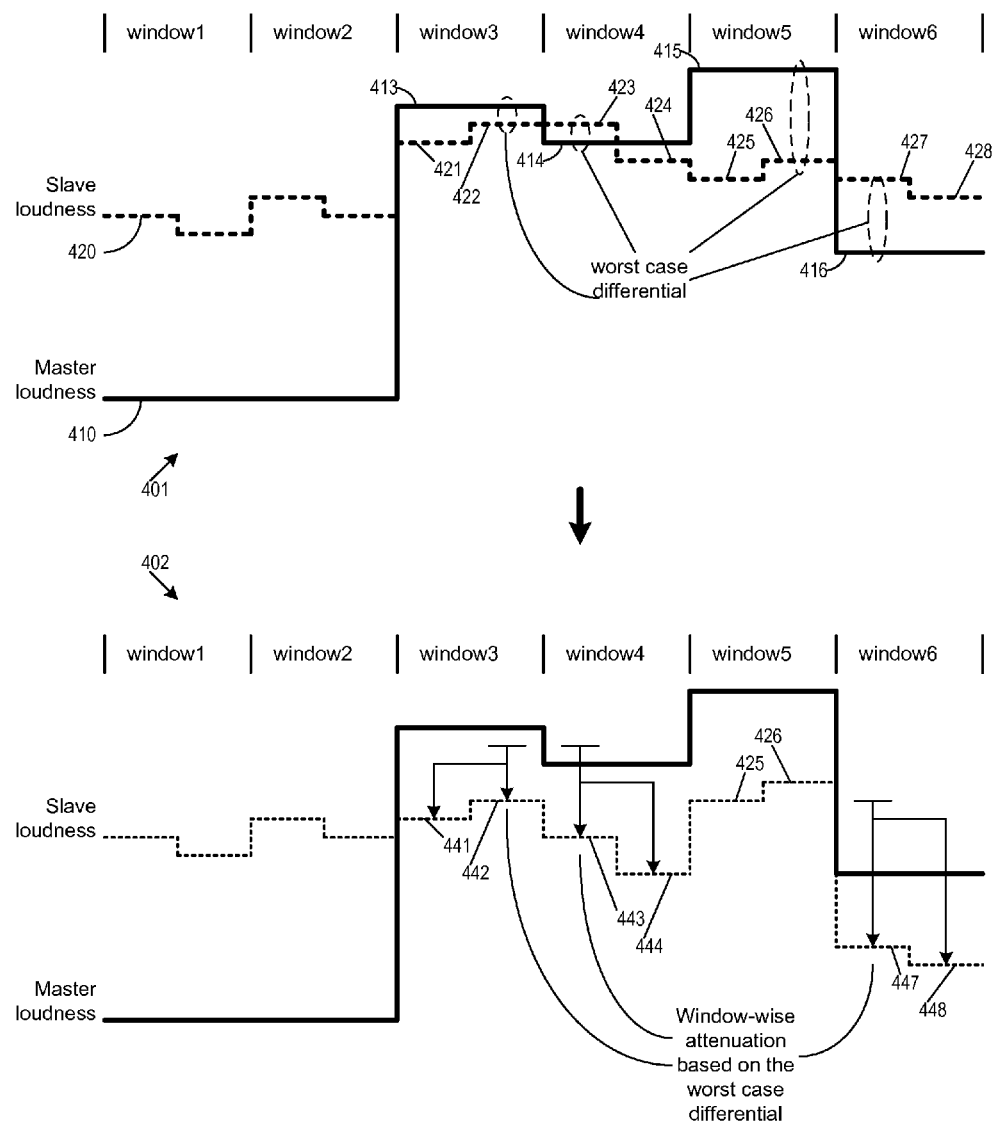
FIG. 4 illustrates a window-by-window audio ducking operation for a master track and a slave track.

FIG. 4 illustrates a window-by-window audio ducking operation for a master track 410 and a slave track 420. The ducking operation is performed over windows 1 through 6. The loudness of the master 210 changes from window to window. The loudness of the slave 220 changes from window to window and within each window. FIG. 4 illustrates the window by window audio ducking operation in two stages 401-402.

Stage 401 illustrates the master and the slave audio before the ducking operation. As illustrated, the master is silent in windows 1 and 2. The master audio is present to require slave ducking in windows 3-6. Within window 3, the master has loudness level 413, and the slave has loudness levels 421 and 422. Within window 4, the master has loudness level 414, and slave has loudness levels 423 and 424. Within window 5, the master has loudness level 415, and the slave has loudness levels 425 and 426. Within window 6, the master has loudness level 416, and the slave has loudness levels 427 and 428.

The worst case differential of each window is the smallest difference (or the most negative difference) between the master's loudness and the slave's loudness of each window. It occurs at a point in the window in which the slave is the loudest relative to the master. In some embodiments, the worst case differential of a window is indicative of the amount of attenuation that is needed for the slave in that window. And when the master's loudness is constant within a window, this differential is based on the maximum loudness of the slave within the window. For window 3, the worst case differential is calculated from the loudness level 422, which is the maximum slave loudness in window 3. For window 4, the worst case differential is calculated from the loudness level 423, which is the maximum slave loudness in window 4. For window 5, the worst case differential is calculated from the loudness level 426, which is the maximum slave loudness in window 5. And for window 6, the worst case differential is calculated from the loudness level 427, which is the maximum slave loudness in window 6.

Stage 402 illustrates the result of the window-by-window audio ducking operation. As illustrated, the slave loudness does not change for windows 1 and 2, since the master audio is absent in these two windows. The slave loudness does not change for window 5, because the worst case differential of the window indicates that the slave's loudness is always below the master's loudness by more than the required separation.

The ducking operation, however, does attenuate slave audio for windows 3, 4, and 6. In each of these windows, the ducking operation attenuates the entire window by an amount that is based on the worst case differential between the slave's loudness and the master's loudness for that window. Specifically, the worst case differential of window 3 (based on loudness 422) is used to reduce loudness levels in window 3 (from 421 to 441 and from 422 to 442). The worst case differential of window 4 (based on loudness 423) is used to reduce loudness levels in window 4 (from 423 to 443 and from 424 to 444). The worst case differential of window 6 (based on loudness 427) is used to reduce loudness levels in window 6 (from 427 to 447 and from 428 to 448).

Some embodiments determine the worst case differential by comparing the master's loudness with the slave's loudness at a few sampling positions with each window. In some embodiments, each window is several seconds wide (e.g., 4 seconds wide) in order to minimize the effect of fluctuations in loudness. Some embodiments analyze an audio track to generate loudness samples several times a second (e.g., 10 samples per second). The loudness samples of an audio track form a momentary loudness curve for that track. The worst case differentials of each window are then determined from the momentary loudness curve of the master and the momentary loudness curve of the slave. FIGS. 5a-f illustrate a content aware audio ducking operation that uses momentary loudness curves for identifying the worst case differential between master and slave for each window.

Figure 5A:
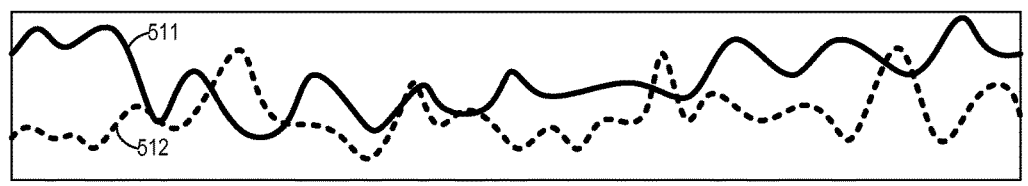
FIGS. 5a-f illustrate a content aware audio ducking operation that uses momentary loudness curves for identifying the worst case differential between master and slave for each window.

FIG. 5a shows a master audio signal 511 and the slave audio signal 512 at their sources, which can be analog signals or digitized signals. In some embodiments, the audio signals are high frequency samples representing the audio's instantaneous sound pressures. As discussed by reference to FIG. 1 in Section I above, in order to convert the oscillatory signals into useful volume or SPL measures of the audio content, some embodiments perform time-averaging calculations (such as RMS) on the instantaneous sound pressure samples over a certain interval of time. The time-averaged values are then converted into sound pressure levels (not shown), which are in turn are mapped to loudness levels (not shown) according human hearing perception.

Figure 5B:
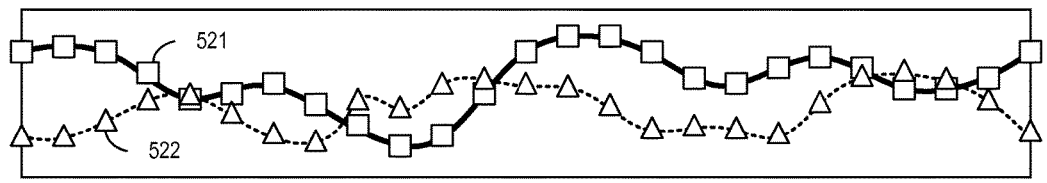

FIG. 5b shows the momentary loudness curves 521 and 522 that are derived from the loudness levels of the master audio signal 511 and of the slave audio signal 512, respectively. In some embodiments, momentary loudness reflects sudden changes in loudness level, i.e., "the loudness of what you hear now". In some embodiments, a momentary loudness curve for an audio track consists of momentary loudness samples that are taken several times a second. Each momentary loudness sample represents the momentary loudness value at its sampling time. In FIG. 5b, each square represents a momentary loudness sample for the master audio and each triangle represents a momentary loudness sample for the slave audio. In some embodiments, each momentary loudness sample is an average value that is based on the amplitudes of the audio signal spanning a time interval around or near the time of sampling. In some of these embodiments, a momentary loudness sample is a biased average that factors in the amplitudes of preceding samples in the audio signal. The generation of momentary loudness samples is discussed in further detail in Section I above.

Figure 5C:
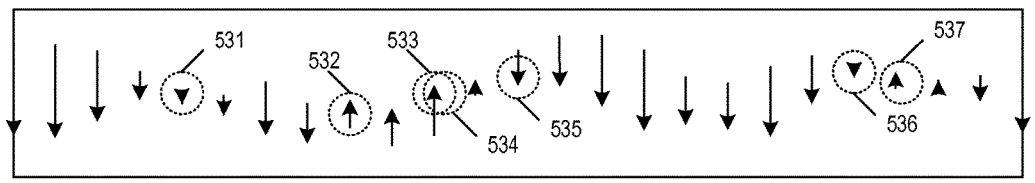

FIG. 5c shows the differential vectors between the samples of the master's momentary loudness curve 521 and the samples of the slave's momentary loudness curve 522. In this example, the differential vectors are derived by subtracting the slave's loudness from the master's loudness. Thus, a vector that points up corresponds to a slave's sample that is louder than the master's sample, and a vector that points down correspond to slave's sample that is quieter than the master's sample.

Figure 5D:
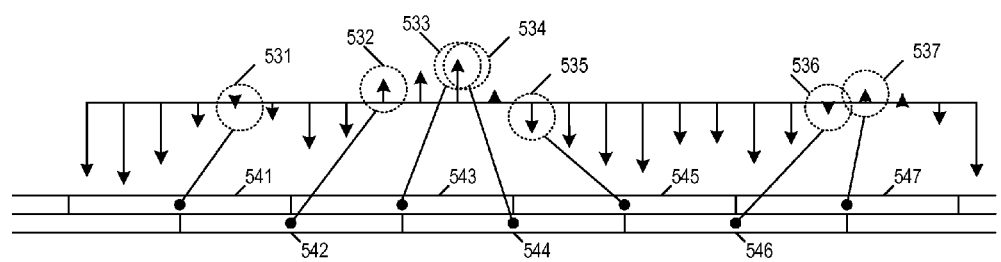

FIG. 5d shows the identification of the worst case differential on a window-by-window basis. FIG. 5d shows windows 541-547 that serve as the basis for the identification of the worst case differentials. As illustrated, the differential vector 531 is identified as the worst case differential in the window 541, because it corresponds to a position in the window 541 at which the slave is the loudest compared to the master. Likewise, the differential vectors 532-537 are identified as the worst case differentials in the windows 542-547, respectively.

The windows 541-547 are overlapping windows. As illustrated, the window 542 overlaps the windows 541 and 543, the window 543 overlaps windows 542 and 544, etc. Because the windows do overlap, it is possible for one differential vector to be identified as the worst case differential vector for two different windows. For example, the identified worst case differential vectors 533 and 534 for windows 543 and 544 are actually the same differential vector, because the same different vector falls within both window 543 and 544. Some embodiments use overlapping windows in order to avoid changing attenuation too abruptly from window to window.

Figure 5E:
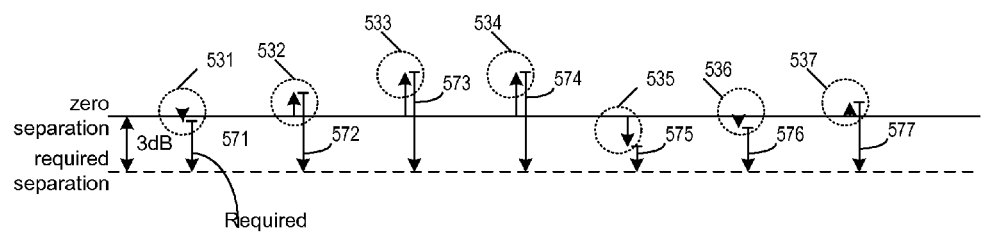

FIG. 5e shows the amount of attenuation that is required for each window in order to provide a 3 dB separation between the master's loudness level and the slave's loudness level. The amount of attenuation of a window is based on the worst case differential between the master's loudness and the slave's loudness for that window. As illustrated, the slave audio in the window 541 is to be attenuated by an attenuation amount 571, and the slave audio in the windows 542-547 is to be attenuated by attenuation amounts 572-577, respectively.

Figure 5F:
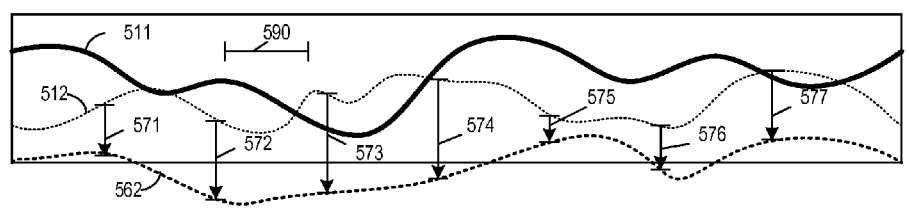

FIG. 5f shows the result of the window-by-window attenuation. Some embodiments apply the computed attenuation to the slave at the sampling rate of the momentary loudness curve. For example, some embodiments adjust/duck the slave audio once every tenth of a second according to the computed attenuations.

Within each window, the slave audio is attenuated by the amount of attenuation determined for that window. As illustrated, the slave audio 512 has been attenuated to 562 to provide at least 3 dB of separation between itself and the master audio 511. Since the windows of this example are overlapping windows and that every audio sample is in two different windows, some embodiments attenuate each audio sample by the average of the two windows that overlap over the audio sample. For example, the slave audio 512 that falls within an interval 590 is attenuated by an amount that is the average of the attenuation amounts 572 and 573, because the interval 590 is within both the window 542 and 543.

In some embodiments, the amount of attenuation in a portion of the slave audio that lies in the intersection of a first window and a second window fades toward the first window for samples that are closer to the center of the first window and fade toward the second window for samples that are closer to the center of the second window. Thus, the slave audio samples in the interval 590 that are closer to the center of the window 543 fade toward applying attenuation 573, while the slave samples that are closer to the center of the window 544 fade toward applying attenuation 574.

Performing content aware audio ducking operation on a window-by-window basis allows the system to filter out short term variations in the loudness in both slave and master. FIGS. 6a-e illustrate an example audio ducking operation in which the slave audio is oscillating. Specifically, FIGS. 6a-e illustrate the ducking of slave audio 612 in the presence of a constant 0 dB master audio 611, where the slave audio 612 varies between −1 dB and −7 dB. Even though the slave audio is oscillating, the worst case differential from each window stays constant. This ensures that the attenuation of the slave loudness stays fairly uniform and allows the ducked slave audio to preserve its original peaks and valleys, albeit at a lower volume.

Figure 6A:
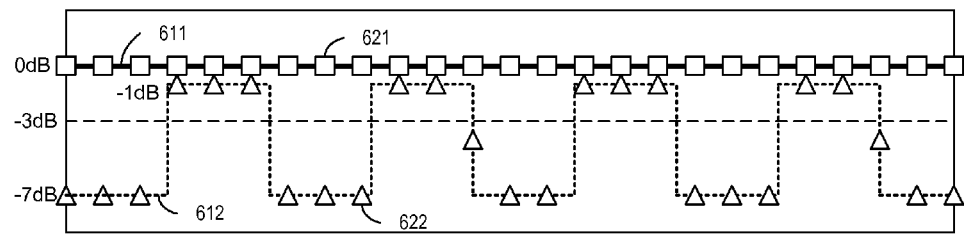
FIGS. 6a-e illustrate an example audio ducking operation in which the slave audio is oscillating.

FIG. 6a shows a master momentary loudness curve 621 and a slave momentary loudness curve 622. The master momentary loudness curve 621 is sampled from the loudness of a master audio 611. The slave momentary loudness curve 622 is sampled from the loudness of a slave audio 612. Each square represents a momentary loudness sample of the master audio and each triangle represents a momentary loudness sample of the slave audio. As illustrated, all of the master samples are at 0 dB, while the slave samples oscillate between −1 dB and −7 dB. The dashed line 690 in FIG. 6a represents the required loudness separation (3 dB) between the master and the slave for this audio ducking operation. As illustrated, there is sufficient separation between the master and the slave when the slave loudness is −7 dB. However, the slave is too loud and must be attenuated when its loudness is at −1 dB.

Figure 6B:
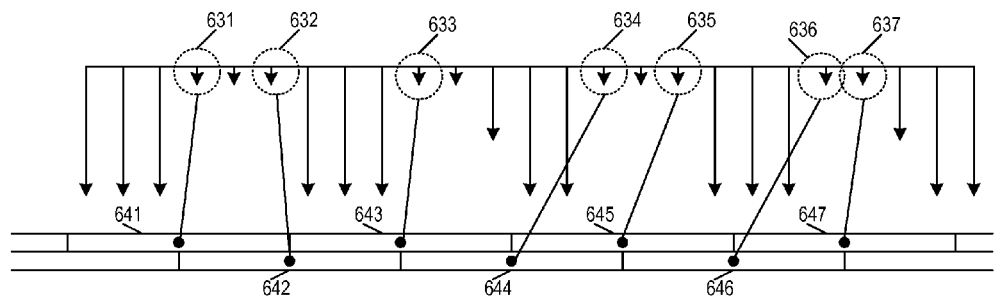

FIG. 6b shows the identification of the worst case differential on a window-by-window basis. FIG. 6b shows the differential vectors between the samples of the master's momentary loudness curve 621 and the samples of the slave's momentary loudness curve 622. FIG. 6b also shows (overlapping) windows 641-647 that serve as the basis for the identification of the worst case differentials. As illustrated, the differential vector 631 is identified as the worst case differential for the window 641, because it corresponds to a position in the window 641 at which the slave is the loudest compared to the master. Likewise, the differential vectors 632-637 are identified as the worst case differentials in the windows 642-647, respectively.

Figure 6C:
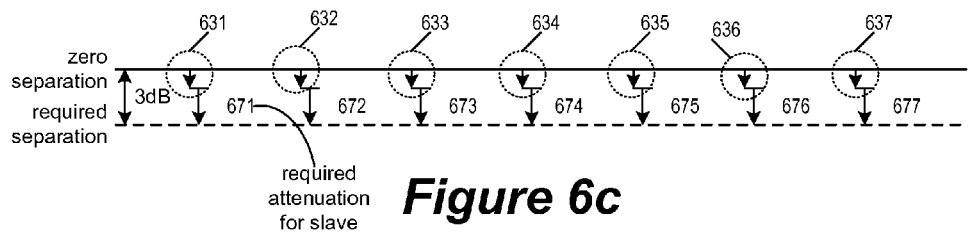

FIG. 6c shows the amount of attenuation 671-677 that is required for each window in order to provide a 3 dB separation between the master's loudness level and the slave's loudness level. The amount of attenuation of a window is based on the worst case differential between the master's loudness and the slave's loudness for that window. Even though the differential vectors within each window vary greatly as the slave samples oscillates, the amount of required attenuation 671-677 for the different windows stays uniform within each window and across the different windows. As illustrated, since the worst case differential for all of the windows is 1 dB, the required attenuation for all of the windows are 2 dB, even though the slave audio oscillates between −1 dB and −7 dB within each window.

Figure 6D:
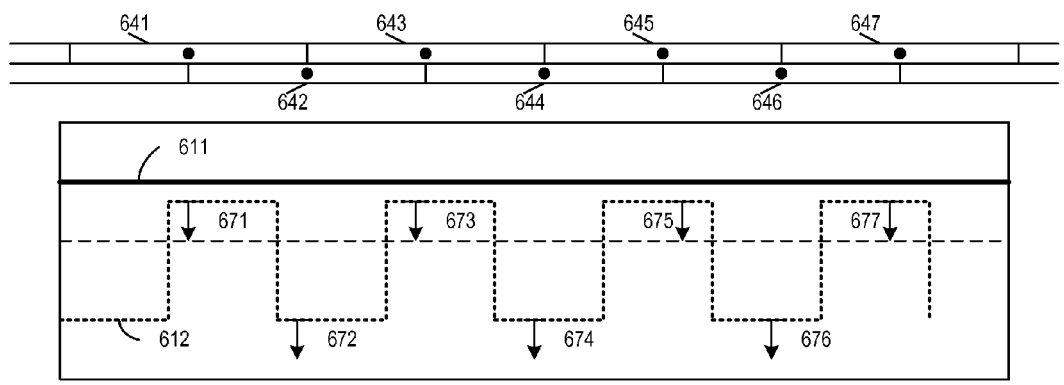
Figure 6E:
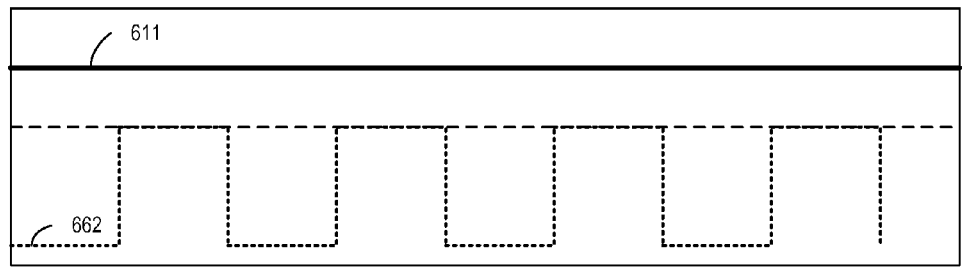

FIG. 6d shows the application of the attenuation on the slave loudness 612. Within each window, the slave audio is attenuated by the amount of attenuation determined for that window. Since the windows of this example are overlapping windows and that every audio sample is in two different windows, some embodiments attenuate each audio sample by the average of the two windows that overlap over the audio sample. However, since all of the windows have the same worst case differential, the illustrated portion of the slave audio 612 will be attenuated by the same amount. FIG. 6e shows the result of the window-by-window attenuation. As illustrated, the slave audio 612 has been attenuated to 662 in order to provide at least 3 dB of loudness separation between itself and the master audio 611.

Some embodiments use windows that are several seconds wide in order to prevent high frequency oscillations from influencing the audio ducking operation. The finite width of these windows also allows the audio ducking operation to track long term changes in the loudness of the audio tracks.

FIGS. 7a-e illustrate the tracking of long term variations by the content aware audio ducking operation.

Figure 7A:
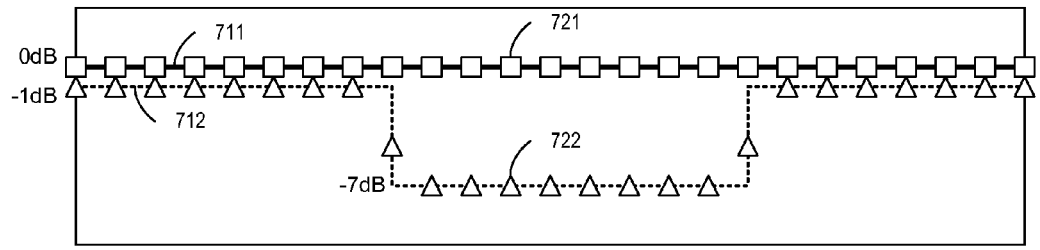
FIGS. 7a-e illustrate the tracking of long term variations by the content aware audio ducking operation.

FIG. 7a shows a master momentary loudness curve 721 sampled from the loudness of a master audio 711 and a slave momentary loudness curve 722 sampled from the loudness of a slave audio 712. Each square represents a momentary loudness sample of the master audio and each triangle represents a momentary loudness sample of the slave audio. As illustrated, all of the master samples are at 0 dB, while the slave samples oscillate between −1 dB and −7 dB. However, the frequency of the oscillation is lower than those shown in FIG. 6a, i.e., it oscillates with a longer period than the width of the windows that are used to identify the worst case differentials.

Figure 7B:
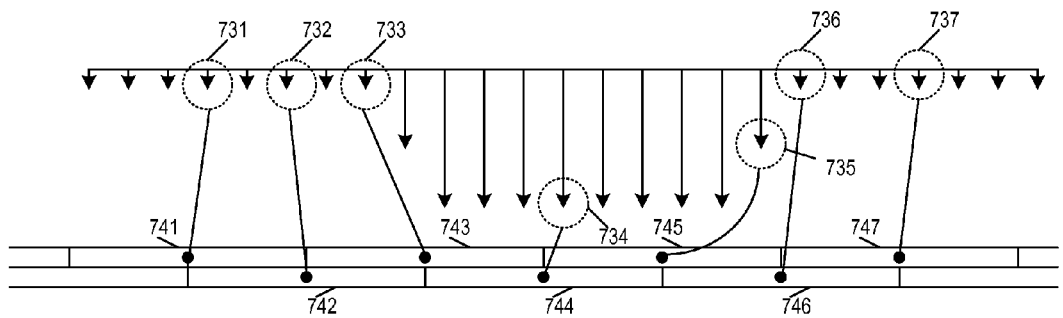

FIG. 7b shows the identification of the worst case differential on a window-by-window basis. FIG. 7b shows the differential vectors between the samples of the master's momentary loudness curve 721 and the samples of the slave's momentary loudness curve 722. FIG. 7b also shows (overlapping) windows 741-747 that serve as the basis for the identification of the worst case differentials. As illustrated, the differential vector 731 is identified as the worst case differential in the window 741, because it corresponds to a position in the window 741 at which the slave is the loudest compared to the master. Likewise, the differential vectors 732-737 are identified as the worst case differentials in the windows 742-747, respectively.

Figure 7C:
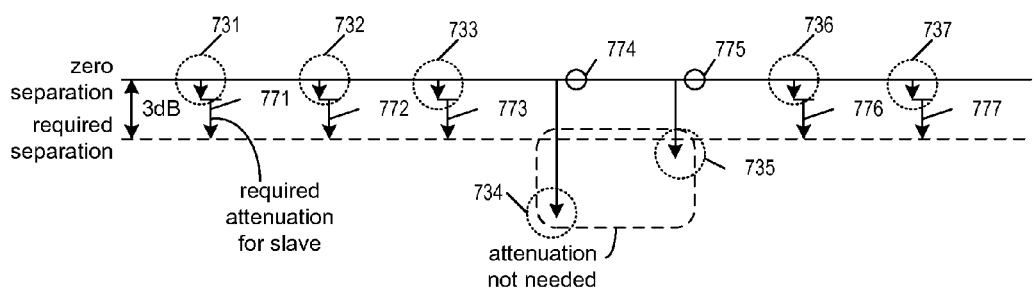

FIG. 7c shows the amount of attenuation that is required for each window in order to provide a 3 dB separation between the master's loudness level and the slave's loudness level. The amount of attenuation of a window is based on the worst case differential between the master's loudness and the slave's loudness for that window. As illustrated, the slave audio in the window 741 is to be attenuated by an attenuation amount 771, and the slave audio in the windows 742-747 is to be attenuated by attenuation amounts 772-777, respectively.

Since the slave audio oscillates slowly, the attenuations for window 744 and the 745 are not the same as the attenuation for windows 741-743 and 746-747. Specifically, the attenuations 774 and 775 reflect the worst case differentials when the slave audio swings down to −7 dB, while the attenuations 771-773 and 776-777 reflect the worst case differential when the slave audio swings up to −1 dB. In fact, the slave audio in this example need not be attenuated within windows 744 and 745, since the loudness of the slave during these windows are quiet enough to provide sufficient loudness separation (3 dB) from the master.

Figure 7D:
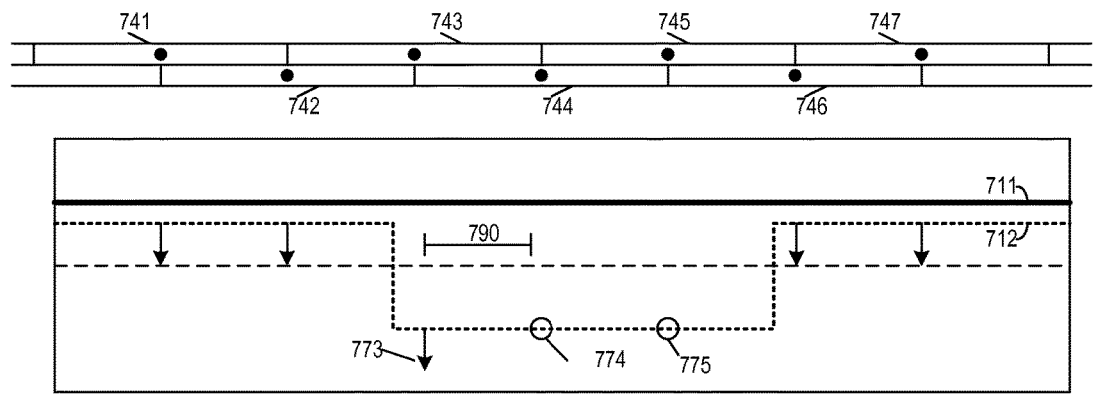
Figure 7E:
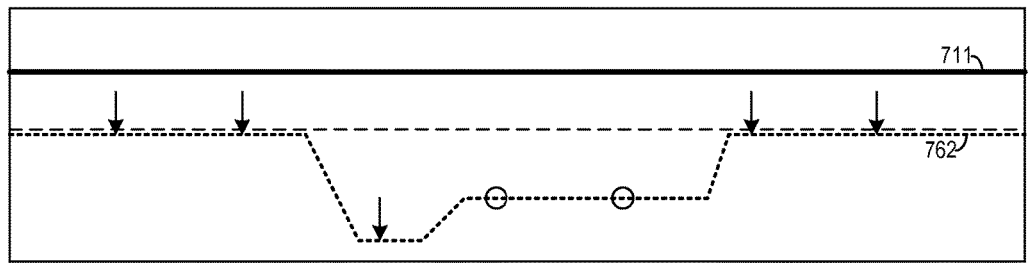

FIG. 7d shows the application of the attenuation on the slave loudness 712. Within each window, the slave audio is attenuated by the amount of attenuation determined for that window, which results in attenuated slave loudness 762 as shown in FIG. 7e.

An audio track may have outlier samples that are very different (e.g., much louder or quieter) than its neighboring samples, often due to noise or errors. In order to minimize the effect of outlier samples in the audio ducking operation, some embodiments introduce an upper bound for the differential between the master and the slave based on the program loudness of the master audio and/or slave audio. Program loudness in some embodiments is the average loudness obtained from a standard algorithm used to comply with loudness standards established for television broadcasts (e.g., ITU-R BS.1770). By using the program loudness values, some embodiments prevent outlier samples that differ greatly from the remainder of the track from causing the slave track to be overly attenuated.

FIGS. 8a-e illustrate a content-aware audio ducking operation that uses program loudness to limit the effect of outlier samples. Specifically, FIGS. 8a-e illustrate an audio ducking operation that uses the difference between the program loudness of a master track 811 and the program loudness of a slave track 812 to limit the worst case differentials for the different windows.

Figure 8A:
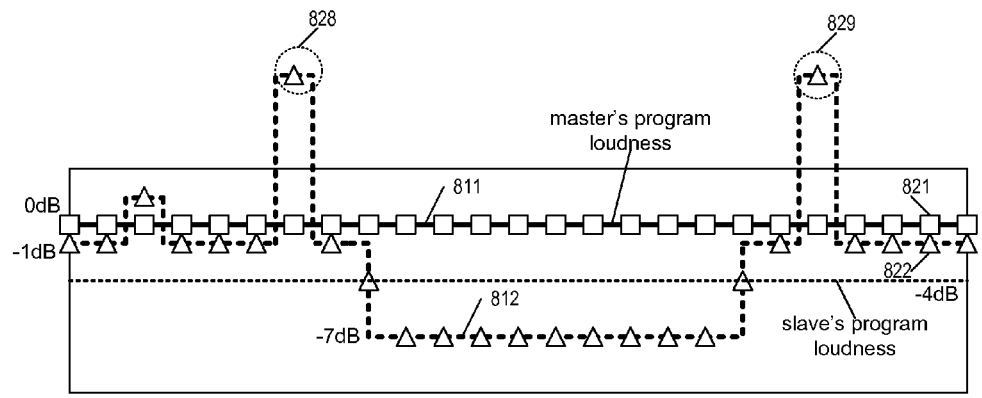
FIGS. 8*a-e* illustrate a content-aware audio ducking operation that uses program loudness to limit the effect of outlier samples.

FIG. 8a shows a master momentary loudness curve 821 sampled from the loudness of the master audio 811 and a slave momentary loudness curve 822 sampled from the loudness of the slave audio 812. Each square represents a momentary loudness sample of the master audio and each triangle represents a momentary loudness sample of the slave audio. As illustrated, the slave samples 828 and 829 from the slave momentary loudness curve 822 are much louder than other slave audio samples. In other words, samples 828 and 829 are outlier samples.

Figure 8B:
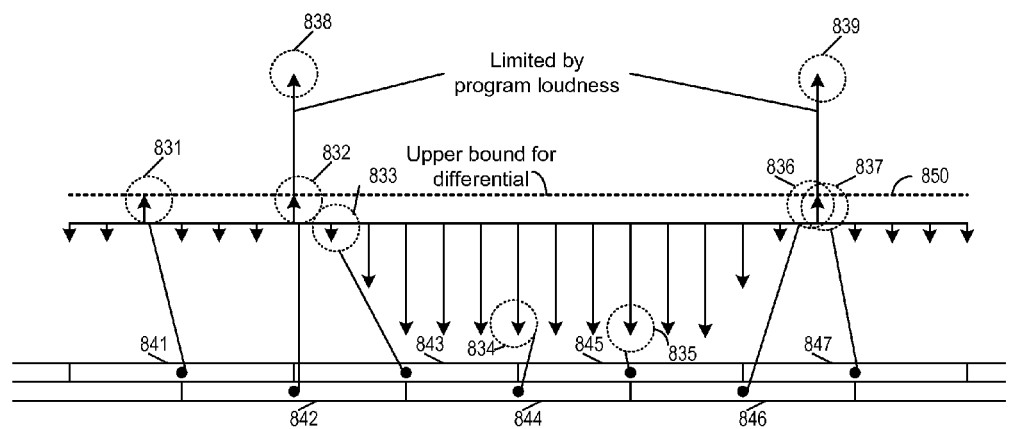

FIG. 8b shows the differential vectors between the samples of the master's momentary loudness curve 821 and the samples of the slave's momentary loudness curve 822. However, since the differentials are computed from audio samples that include outliers (828 and 829), some of the differential vectors (838 and 839) are also outliers. These outlier differential vectors are limited by an upper bound 850 that is computed based on the program loudness of the master and the program loudness of the slave. In some embodiments, this upper bound 850 is defined by a threshold value from the difference value between the program loudness of the master and the program loudness of the slave. In this example, the master's program loudness is 0 dB and the slave's program loudness is −4 dB. Based on the difference between the program loudness values of the master and the slave, the upper bound for the differential between the master and the slave for purpose of audio ducking is set to be 1 dB.

One of ordinary skill would understand these numbers are chosen arbitrarily for the purpose of illustration, and that some embodiments may select other threshold values. In some embodiments, the differential vectors between the master and the slave are limited to within 3 dB of the difference between the program loudness of the master and the program loudness of the slave.

FIG. 8b also shows the identification of the worst case differentials on a window-by-window basis. In this instance, such identification is based on differential vectors that are limited by the upper bound 850. FIG. 8b shows (overlapping) windows 841-847 that serve as the basis for the identification of the worst case differentials. As illustrated, the differential vector 831 is identified as the worst case differential in the window 841, because it corresponds to a position in the window 841 at which the slave is the loudest compared to the master. Likewise, the differential vectors 832-837 are identified as the worst case differentials in the windows 842-847, respectively. Particularly, the worst case differentials for windows 841, 842, 846, and 847 are differentials that have been limited by the upper bound 850. Because the windows are overlapping windows, the identified worst case differentials 836 and 837 for the windows 846 and 847 are the same differential vector that falls within both windows 846 and 847.

Figure 8C:
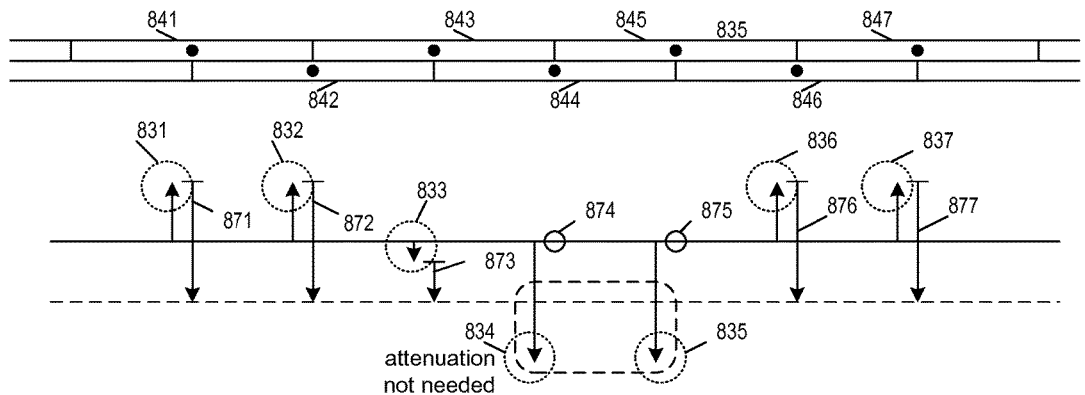

FIG. 8c shows the amount of attenuation that is required for each window in order to provide a 3 dB separation between the master's loudness level and the slave's loudness level. The amount of attenuation of a window is based on the worst case differential between the master's loudness and the slave's loudness for that window. As illustrated, the slave audio in the window 841 is to be attenuated by an attenuation amount 871, and the slave audio in the windows 842-847 is to be attenuated by attenuation amounts 872-877, respectively. Particularly, attenuations 871, 872, 876, and 877 are based on differentials that are limited by the program loudness.

Figure 8D:
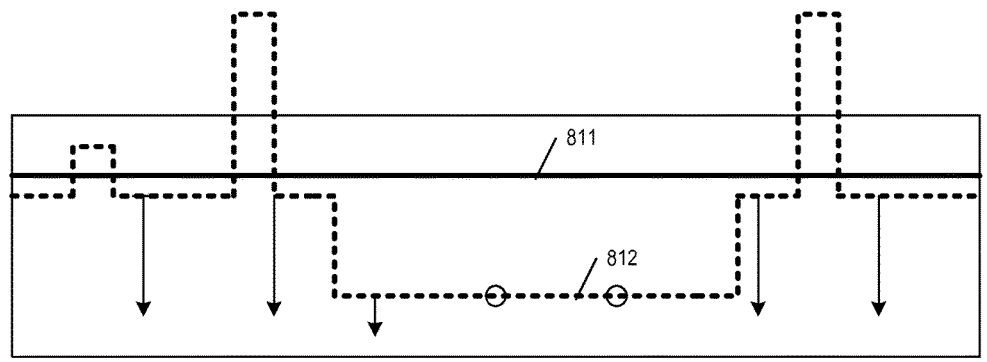
Figure 8E:
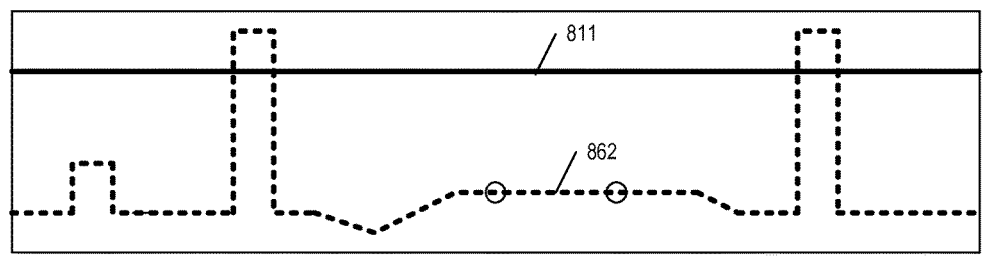

FIG. 8d shows the application of the attenuations on the slave loudness 812. Within each window, the slave audio is attenuated by the amount of attenuation determined for that window, which result in attenuated slave loudness 862 in FIG. 8e. It is clear from the attenuated slave loudness 862 that the ducking of the slave track is not based on the loudness of the outlier samples 828 and 829.

Figure 9:
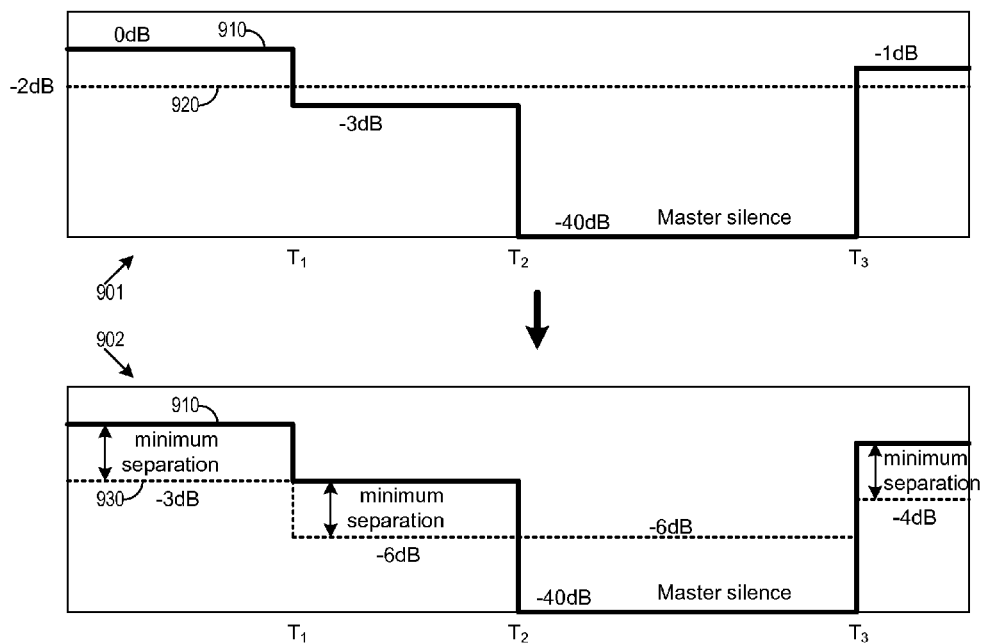
FIG. 9 illustrates a content aware audio ducking operation in which a master audio becomes silent after the audio ducking operation has commenced.

As mentioned, the audio ducking operation ducks the slave track when there is audio present in the master track, and that the slave track is not ducked until the master audio is present. In some embodiments, if the master becomes silent after having caused the slave audio to be ducked, the slave audio would stay at a previously ducked loudness level rather returning to full loudness or become silent itself. FIG. 9 illustrates a content aware audio ducking operation in which a master audio 910 becomes silent after the audio ducking operation has commenced. A slave audio 920 is attenuated by the audio ducking operation, but does not become silent when the master becomes silent. FIG. 9 illustrates the audio ducking operation in two stages 901-902.

The first stage 901 shows the master track 910 and the slave track 920 before the audio ducking operation. The master audio loudness is at 0 dB before time $T_1$, −3 dB between time $T_1$ and time $T_2$, drops to −40 dB (silence) between $T_2$ and $T_3$, and returns to −1 dB after $T_3$. The slave audio loudness is at −2 dB throughout.

The second stage 902 shows a ducked slave loudness level 930 after the audio ducking operation. The audio ducking operation attenuates the slave audio 920 to provide a minimum separation between the slave's loudness and the master's loudness. As illustrated, the slave loudness 930 is at −3 dB before $T_1$, at −6 dB from $T_1$ to $T_3$, and at −4 dB after $T_3$. As the master's loudness level drops to −40 dB (which is below floor silence level) at $T_2$, the slave no longer base its attenuation on trying to provide a minimum separation between its own loudness level and the master's loudness level. The slave instead applies the same amount of attenuation from before $T_2$ (immediately before master become silent), which keeps the slave loudness level at −6 dB until $T_3$.

In some embodiments, the audio ducking operation does not return slave audio to its original loudness no matter how long the master has already become silent. In some of these embodiments, the system returns slave audio to its original loudness level only after the master track has finished. In some other embodiments, if the master audio has remain in silence for too long, the content-aware audio ducking operation will restore the slave audio to its original loudness after certain amount of time.

Figure 10:
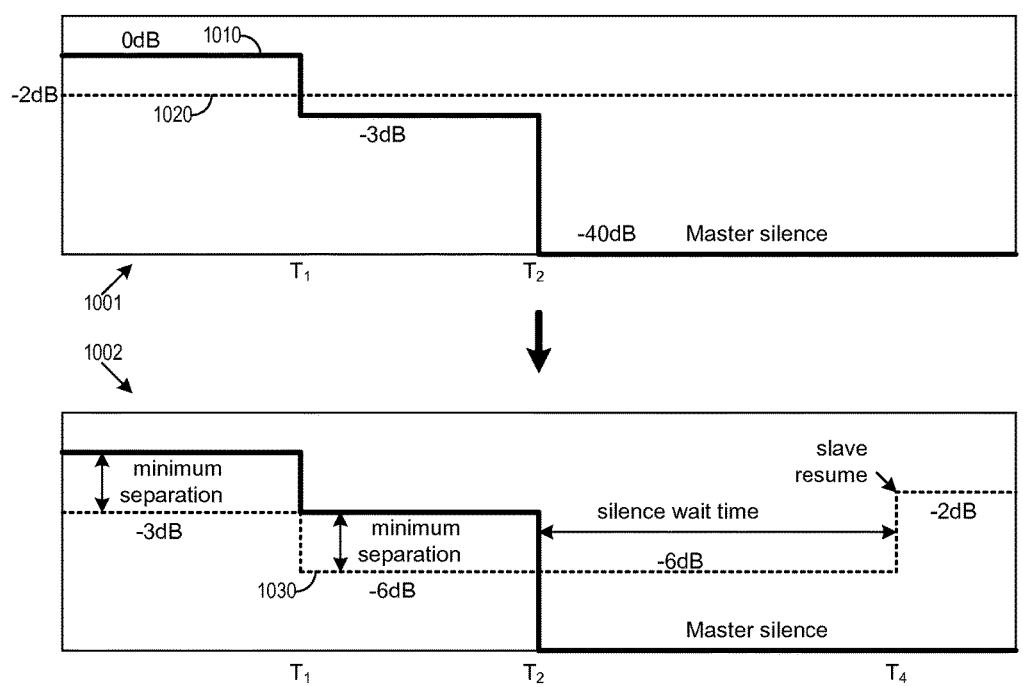
FIG. 10 illustrates an audio ducking operation in which the slave resumes its original loudness after the master has become silent for longer than a threshold amount of time.

FIG. 10 illustrates an audio ducking operation in which the slave resumes its original loudness after the master has become silent for longer than a threshold amount of time. FIG. 10 illustrates a master audio 1010 and a slave audio 1020 before and after the audio ducking operation in two stages 1001 and 1002.

The first stage 1001 shows the master track 1010 and the slave track 1020 before the audio ducking operation. The master audio loudness is at 0 dB before time $T_1$, −3 dB between time $T_1$ and time $T_2$, drops to −40 dB (silence) after $T_2$ and remain silent afterwards. The slave audio loudness is at −2 dB throughout.

The second stage 1002 shows the ducked slave loudness 1030 after the audio ducking operation. The audio ducking operation attenuates the slave audio 1020 to provide a minimum separation between the slave's loudness and the master's loudness. As illustrated, the ducked slave loudness 1030 is at −3 dB before $T_1$, at −6 dB from $T_1$ to $T_4$, and returns to its original loudness level of −2 dB after $T_4$. At time $T_4$, the audio ducking operation determines that the master has been silent for sufficient amount of time, and that the slave should no longer be ducked as the master audio is no longer present. Some embodiments then restore the slave to its original loudness by gradually fading slave audio back in.

Figure 11:
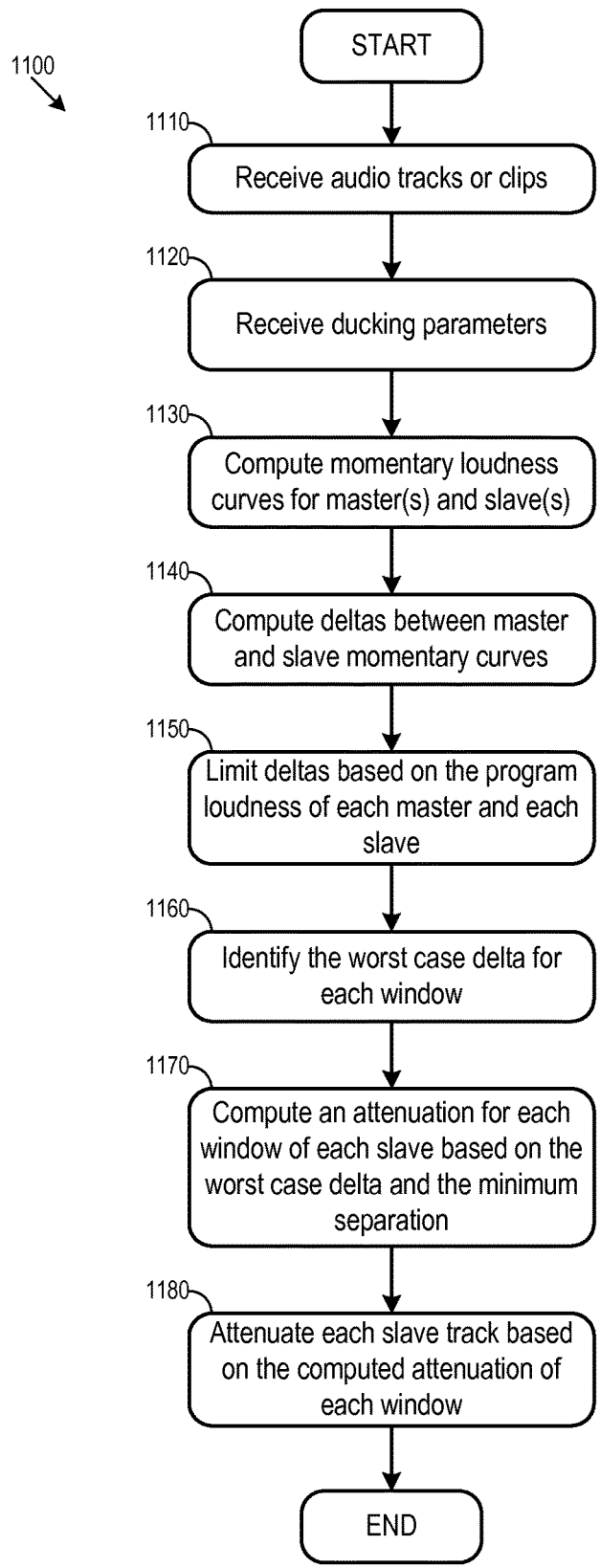
FIG. 11 conceptually illustrates a process for performing content aware audio ducking.

For some embodiments, FIG. 11 conceptually illustrates a process 1100 for performing content aware audio ducking. The process 1100 starts by receiving (at 1110) audio tracks or clips. Some embodiments retrieve the audio content from a storage device. Some embodiments receive the audio tracks as audio streams from one or more live audio sources (such as microphones). In some embodiments, the audio signals received by the process 1100 prior to ducking are preprocessed for calculating loudness values.

The process then receives (at 1120) audio ducking parameters. In some embodiments, these parameters specify which of the audio clips or tracks are to be the master(s) of the ducking operation. In some embodiments, these parameters also specify the required minimum separation from each master track. The setting of the audio ducking parameters will be described further in Section III below.

Next, the process computes (at 1130) the momentary loudness curves for the master(s) and the slave(s). In some embodiments, the momentary loudness samples are computed from a human loudness perception mapping of the sound pressure levels of the incoming audio signals. Some embodiments produce several momentary loudness samples a second (e.g., 10) for each audio track. The generation of momentary loudness samples is discussed in further detail in Section I above and by reference to FIGS. 5a-b above. The process then computes (at 1140) the deltas (or the differentials) between each master momentary loudness curve and each slave momentary loudness curve.

The process next limits (at 1150) the deltas based on the program loudness of the master(s) and of the slave(s). In some embodiments, the program loudness values are used to set an upper bound for the deltas so outlier audio samples will not greatly affect the audio ducking operation. The use of program loudness values is described above by reference to FIGS. 8a-e.

The process then identifies (at 1160) worst case deltas on a window-by-window basis. As mentioned, some embodiments perform the content aware audio ducking operations on a window-by-window basis so to avoid the effects of short term oscillations in the audio content (of both master and slave). The identification of worst case delta for each window is described above by reference by FIGS. 5d, 6b, 7b, and 8b.

The process next computes (at 1170) an attenuation amount for each window of each slave based on the worst case delta identified in 1160 and the minimum separation received in 1120. The amount of attenuation for each given window is computed to ensure that the loudness of the slave will not exceed a maximum loudness level established by the minimum separation from the master. In some embodiments that allow multiple ducking masters, each slave is attenuated by an amount that ensures the slave would satisfy minimum separation requirement for all masters.

The process then attenuates (at 1180) each slave based on the computed attenuation for each window. Window-by-window attenuation is described above by reference to FIGS. 5e-f, 6c-e, 7c-e, and 8c-d. In some embodiments, the process 1100 detects whether a master has become silent. If a master has become silent for a particular window, the process would continue attenuate the slave based on a previous non-silent loudness level for the master in order to avoid silencing the slave. The handling of a master audio that becomes silent is described above by reference to FIGS. 9-10.

III. Specifying Audio Ducking Parameters

Figure 12:
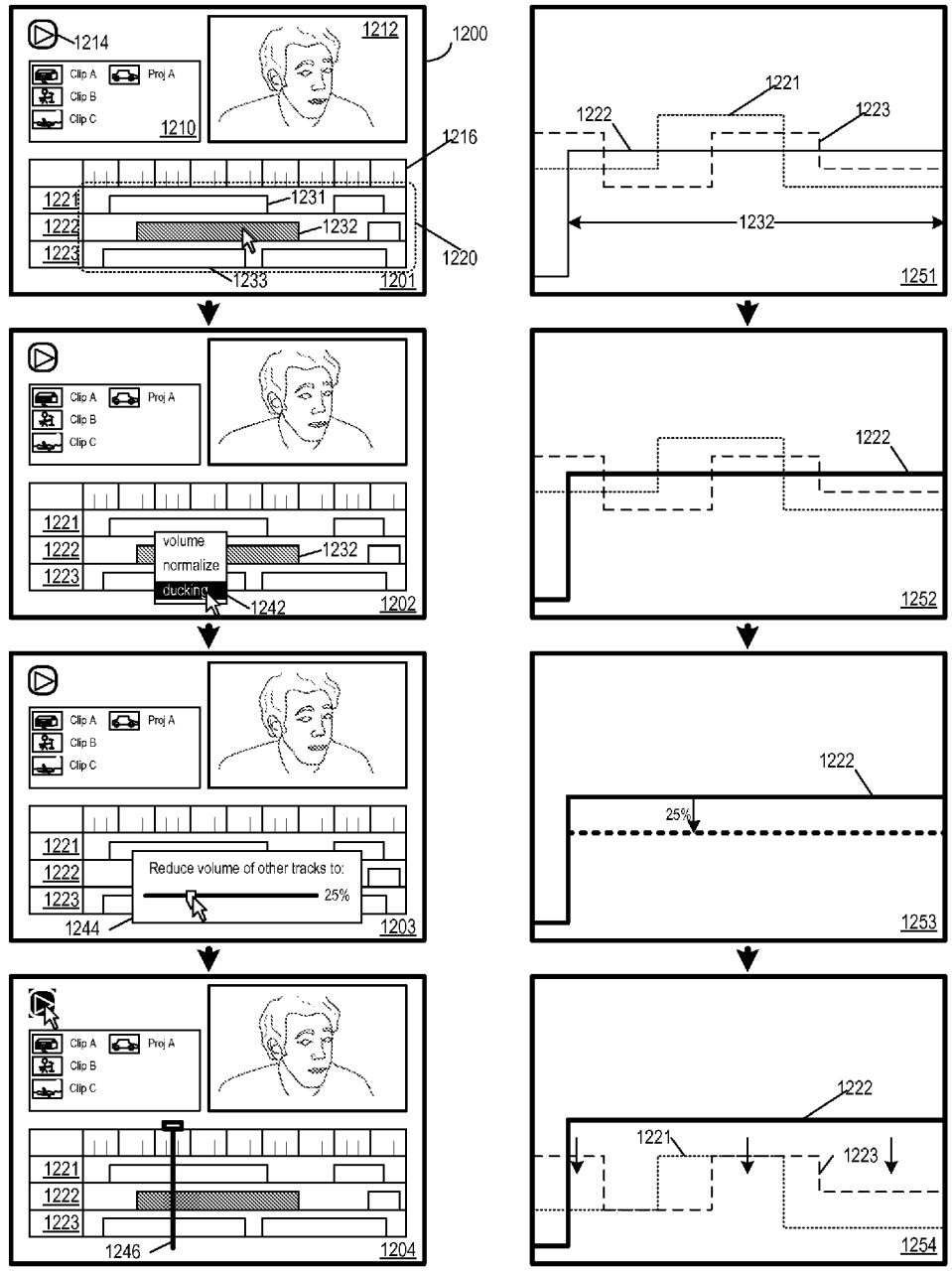
FIG. 12 illustrates a media editing application that performs audio ducking operations.

As mentioned above, in some embodiments, the audio ducking operation is performed by a media editing application running on a computing device. The media editing application supports audio ducking by designating one or more audio tracks as masters and one or more audio tracks as slaves. The media editing application also provides the specification for minimum separation between the loudness of masters and the loudness slaves. FIG. 12 illustrates a media editing application that supports audio ducking operations.

FIG. 12 illustrates an example GUI 1200 of the media editing application. The GUI 1200 includes a media library area 1210, a playback preview area 1212, a playback activation item 1214, and a timeline 1216. The media library area 1210 includes several graphical representations of media clips that can be imported into the timeline 1216 for making a composite presentation 1220. The playback activation item 1214 is for activating the playback of the composite presentation 1220, which can be previewed in the playback preview area 1212. The composite presentation 1220 includes several tracks 1221-1223 that contain media clips, including media clips 1231, 1232, and 1233. Each of the media clips 1231-1233 is either an audio clip or a video clip that includes audio content. FIG. 12 also illustrates audio loudness plots 1251-1254 that correspond to the loudness of the audio content of the composite presentation 1220, i.e., the loudness of the audio content of tracks 1221-1223.

FIG. 12 illustrates audio ducking operation in four stages 1201-1204 of the GUI 1200. At the first stage 1201, none of the audio content has been designated as the master of the audio ducking. However, the user is about to select the clip 1232 of the track 1222 (as indicated by a cursor). The corresponding loudness plot 1251 shows the loudness level of the tracks 1221-1223 over an interval of time during which the clip 1232 is scheduled to play. None of the media clips have been designated as the master of the audio ducking operation, and none of the tracks have been attenuated as slaves of the ducking operation.

The second stage 1202 shows the designation of master and slaves for the audio ducking operation. As illustrated, the user has brought up a pop-up menu 1242 by selecting (e.g., right clicking) the clip 1232. The pop-up menu 1242 includes a number menu items for audio related commands that are applicable to the clip 1232 or to the track 1222. From these menu items, the user has selected "ducking", which causes the clip 1232 to be designated as the master audio of the ducking operation. This means that, as long as the clip 1232 is playing on the track 1222, other clips playing on other tracks (i.e., the clip 1231 playing on the track 1221 and the clip 1233 playing on the track 1223) must duck in favor of the audio content in the clip 1232. The corresponding loudness plot 1252 highlights the loudness of the track 1222, indicating that it is playing the content of a clip (i.e., clip 1232) that has been designated as the master of the audio ducking operation.

The third stage 1203 shows the setting of the required separation between the loudness of the master and the loudness of the slaves. The selection of the menu item "ducking" has brought up a slider 1244 for setting the loudness separation between the master and the slaves. In this example, the user has moved the slider to "25%", indicating that the slaves' loudness shall be at least 25% less than the master's loudness. Namely, the loudness of the content on tracks 1221 and 1223 must be at least 25% less than the loudness of the track 1222 during the time when the clip 1232 is playing. The corresponding loudness plot 1253 shows the setting of the required loudness separation between the master track 1222 and the slave tracks 1221 and 1223. One of ordinary skill would realize that there are many ways of specifying the loudness separation between the master and the slave. For example, the user can type in the number of decibels that is required to separate the loudness of the master and of the slaves.

The fourth stage 1204 shows the ducking of the slave audio loudness level during playback. The GUI 1200 shows the user selecting the playback activation item 1214 in order to start the playback of the composite presentation 1220, which brings up a playhead 1246. The corresponding loudness plot 1254 shows that slave audio (audio content of tracks 1221 and 1223) have been attenuated to provide the required 25% separation from the master audio (the clip 1232 playing in the track 1222).

In some embodiments, the media editing application creates composite presentations that places media clips in spine or anchor lanes rather than in tracks. Spine and anchor lanes will be further described in Section IV below. The media editing application in some of these embodiments designates the audio content of one of these lanes (spine or anchor) as the master of the audio ducking operation.

Figure 13:
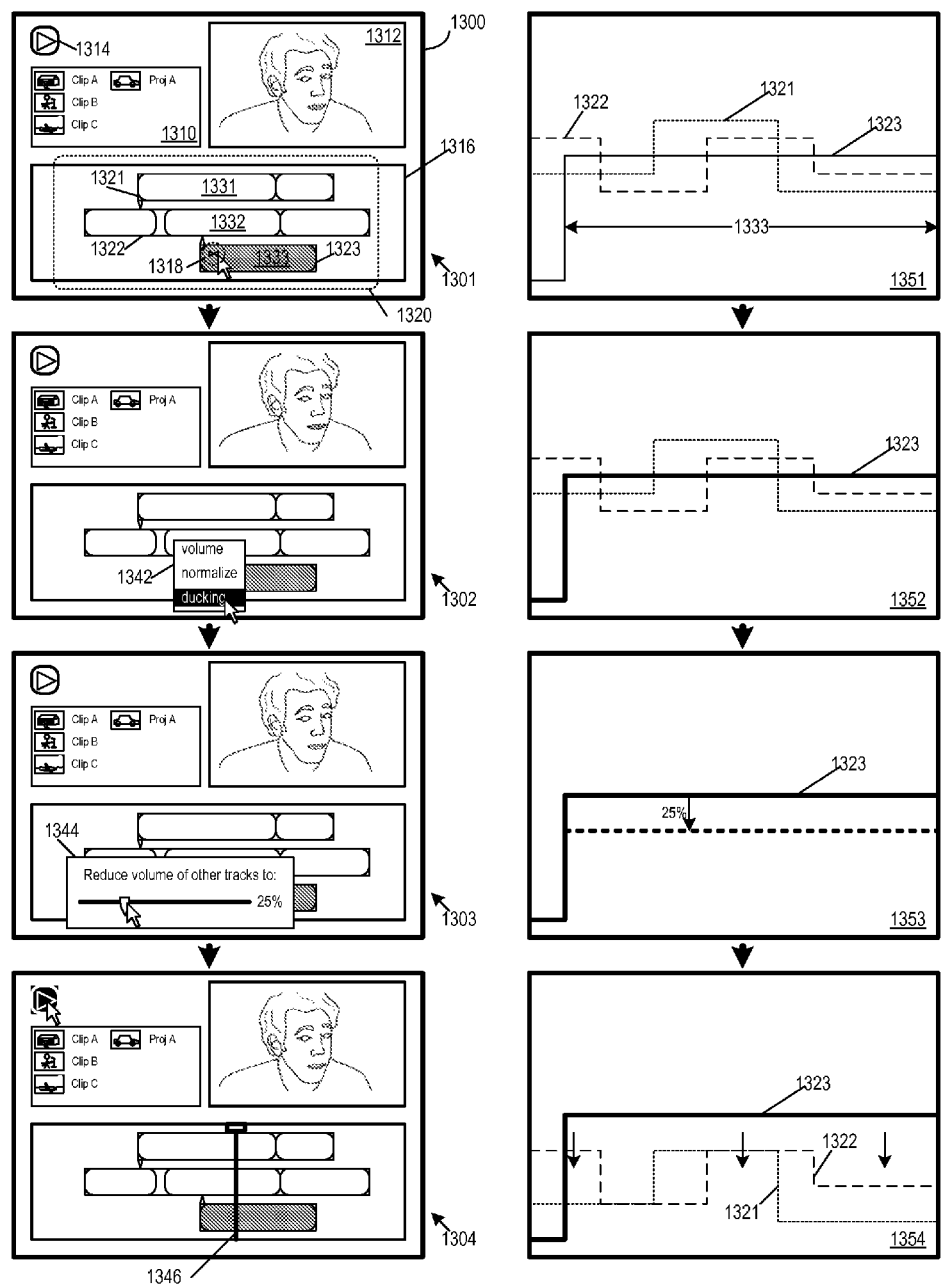
FIG. 13 illustrates an example GUI of a media editing application that places media clips in spine or anchor lanes.

FIG. 13 illustrates an example GUI 1300 of a media editing application that places media clips in spine or anchor lanes. Like the GUI 1200, the GUI 1300 also includes a media library area 1310, a playback preview area 1212, a playback activation item 1314, and a timeline 1316. The timeline 1316 is for making a composite presentation 1320 that includes several video and/or audio clips. Unlike the timeline 1216 of FIG. 12 which includes tracks, the timeline 1316 includes a spine lane 1322 and anchor lanes 1321 and 1323. Anchor lanes 1321 and 1322 are anchored to the spine lane 1322. Each lane includes one or more media clips. The spine lane 1322 contains media clip 1332, the anchor lane 1321 contains media clip 1331, and the anchor lane 1323 contains media clip 1333. FIG. 13 also illustrates audio loudness plots 1351-1354 that correspond to the loudness of the audio content of the composite presentation 1320, i.e., the loudness of the audio content of lanes 1321-1323.

FIG. 13 illustrates the audio ducking operation in four stages 1301-1304 of the GUI 1300. At the first stage 1301, none of the audio content has been designated as the master of the audio ducking. However, the user is about to select the clip 1333 of the anchor lane 1323 (as indicated by a cursor). The corresponding loudness plot 1351 shows the loudness level of the lanes 1321-1323 over an interval of time during which the clip 1333 is scheduled to play. None of the media clips have been designated as the master of the audio ducking operation, and none of the lanes have been attenuated as slaves of the ducking operation.

The second stage 1302 shows the designation of master and slave for the ducking operation. As illustrated, the user has brought up a pop-up menu 1342 by selecting an audio adjustment item 1318 associated with the clip 1333. The pop-up menu 1342 includes a number menu items for audio related operations that are applicable to the clip 1333 or to the anchor lane 1323. From these menu items, the user has selected "ducking", which causes the clip 1333 to be designated as the master audio of the ducking operation. This means that, as long as the clip 1333 is playing in the anchor lane 1323, other clips playing on other lanes (e.g., clip 1331 playing on the anchor lane 1321 and the clip 1332 playing on the spine lane 1322) must duck in favor of the audio content in clip 1333. The corresponding loudness plot 1352 highlights the loudness of the lane 1323, indicating that it is playing the content of a clip (i.e., the clip 1333) that has been designated as the master of the audio ducking.

The third stage 1303 shows the setting of the required separation between the loudness of the master and the loudness of the slave. The selection of the menu item "ducking" has brought up a slider 1344 for setting the separation between the master and the slaves. In this example, the user has moved the slider to "25%", indicating that the slave's loudness shall be at least 25% less than the master's loudness. Namely, the loudness of the content on the anchor lane 1321 and the spine lane 1322 must be at least 25% less than the loudness of the anchor lane 1323 during the time when the clip 1333 is playing. The corresponding loudness plot 1353 shows the setting of the required loudness separation between the master (lane 1323) and the slaves (lanes 1321 and 1322).

The fourth stage 1304 shows the ducking of the slave audio loudness level during playback. The GUI 1300 shows the user selecting the playback activation item 1314 in order to start the playback of the composite presentation 1320, which brings up a playhead 1346. The corresponding the loudness plot 1354 shows that slave audio (audio content of lanes 1321 and 1322) have been attenuated to provide the required 25% separation from the master audio (the clip 1333 playing in the anchor lane 1323).

FIGS. 12 and 13 illustrates an audio ducking operation in which only one audio track is designated as the master, however, one of ordinary skill would understand that a media editing application in some embodiments can also designate multiple audio ducking masters. For example, the user of the media editing application of FIG. 12 can right click on another track (e.g., 1221) in order to designate it as a second ducking master and specify a corresponding minimum loudness separation.

Figure 14:
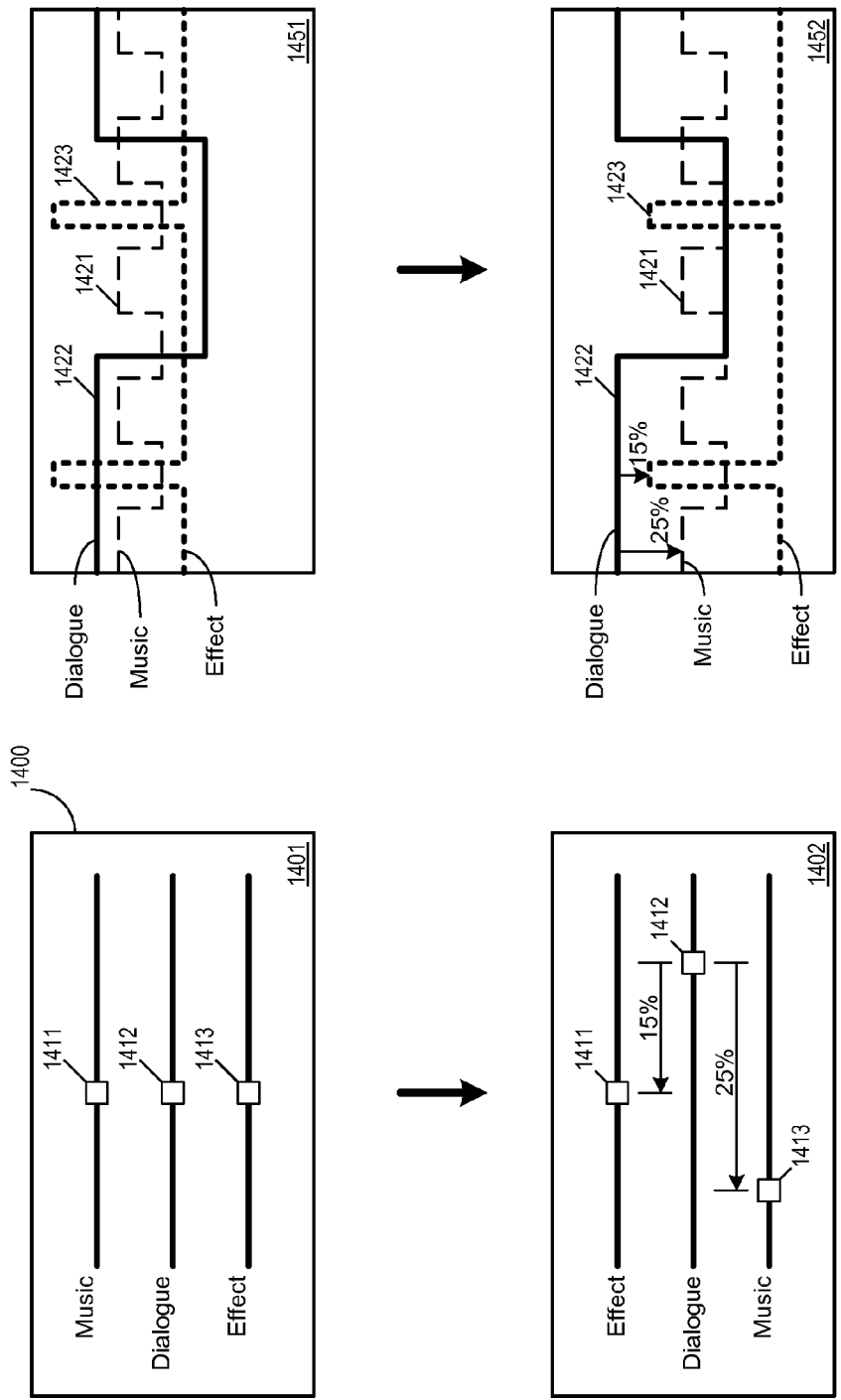
FIG. 14 illustrates an audio ducking operation that includes multiple loudness separation specifications for multiple slaves.

Some embodiments apply one loudness separation requirement between the master and all of the ducking slaves. However, some embodiments specify and apply different loudness separation from the master for different slaves. In some embodiments, the audio ducking operation specifies different loudness separation between different pairing of audio tracks or media clips. FIG. 14 illustrates an audio ducking operation that includes multiple loudness separation specifications for multiple slaves.

FIG. 14 illustrates an audio loudness adjustment panel 1400. The panel includes three sliders 1411-1413 for adjusting the loudness levels for a dialogue track 1421, a music track 1422, and an effects track 1423. However, the loudness adjustment panel is not for independently specifying the loudness of the different tracks of audio. Instead, the loudness adjustment panel 1400 is for specifying loudness separation between the different tracks of audio. The specified loudness separations are then used to attenuate some of the tracks in audio ducking operations. The loudness adjustment panel can be regarded as setting the relative loudness levels between the different tracks of audio in some embodiments.

FIG. 14 illustrates the ducking operations in two stages 1401-1402. Each stage shows the setting of the sliders 1411-1413 in the panel 1400 as well as a corresponding loudness plot for the tracks 1421-1423. At the first stage 1401, the loudness adjustment panel 1400 is at its default condition without any specification on the relative loudness between the different tracks. All three sliders are aligned, indicating that there is no specification of loudness separation between any of the tracks. The corresponding loudness plot 1451 shows the loudness levels of the tracks 1421-1423. None of the tracks is attenuated relative to another.

The second stage 1402 shows the use of the sliders for specifying loudness separations between the three tracks. Specifically, the slider 1412 for the dialogue track 1422 has been moved to introduce a 15% separation between dialogue and music. The slider 1413 for the effects track has been moved to introduce a 25% separation between music and dialogue. The corresponding loudness plot 1452 shows the attenuation of the loudness levels of the effect track 1423 and the music track 1421 to provide the requisite separation in loudness from the dialogue track 1422.

Some embodiments further use the setting of relative loudness levels to distribute a total loudness among the different tracks. For the example of FIG. 14, the loudness energy of the dialogue is 100/(85+75+100)=38.5% of the total loudness, the loudness energy of the music is 75/(85+75+100)=28.9% of the total loudness, and the loudness energy of the effect is 85/(85+75+100)=32.7% of the total loudness. In some of these embodiments, if a slave's loudness before ducking is below its specified distribution (e.g., its loudness is far below its minimum loudness separation from the master), an audio system such as the audio system 100 of FIG. 1 would boost the slave's loudness level by amplifying its signal.

For some embodiments, the different tracks controlled by the sliders 1411-1413 are tracks or lanes in a media editing application similar to those discussed above by reference to FIGS. 12 and 11. For example, some embodiments bring up a panel similar to the loudness adjustment panel 1400 when the user specifies audio ducking parameters by selecting a media clip in a track or in a lane.

Some embodiments identify the different tracks being controlled by the panel 1400 based on metadata information that accompanies the media content. Specifically, the media editing application in some embodiments associate the sliders 1411-1413 with media clips in the composite presentation based on the metadata in the media clips. For example, a media clip marked as "music" by its metadata will have its loudness controlled by the slider 1411, and a media clip marked as "dialogue" will have its loudness controlled by the slider 1412, etc. In some embodiments, the metadata in the media clips are used to derive a set of initial slider settings for the different media clips.

IV. Software Archtecture

Figure 15:
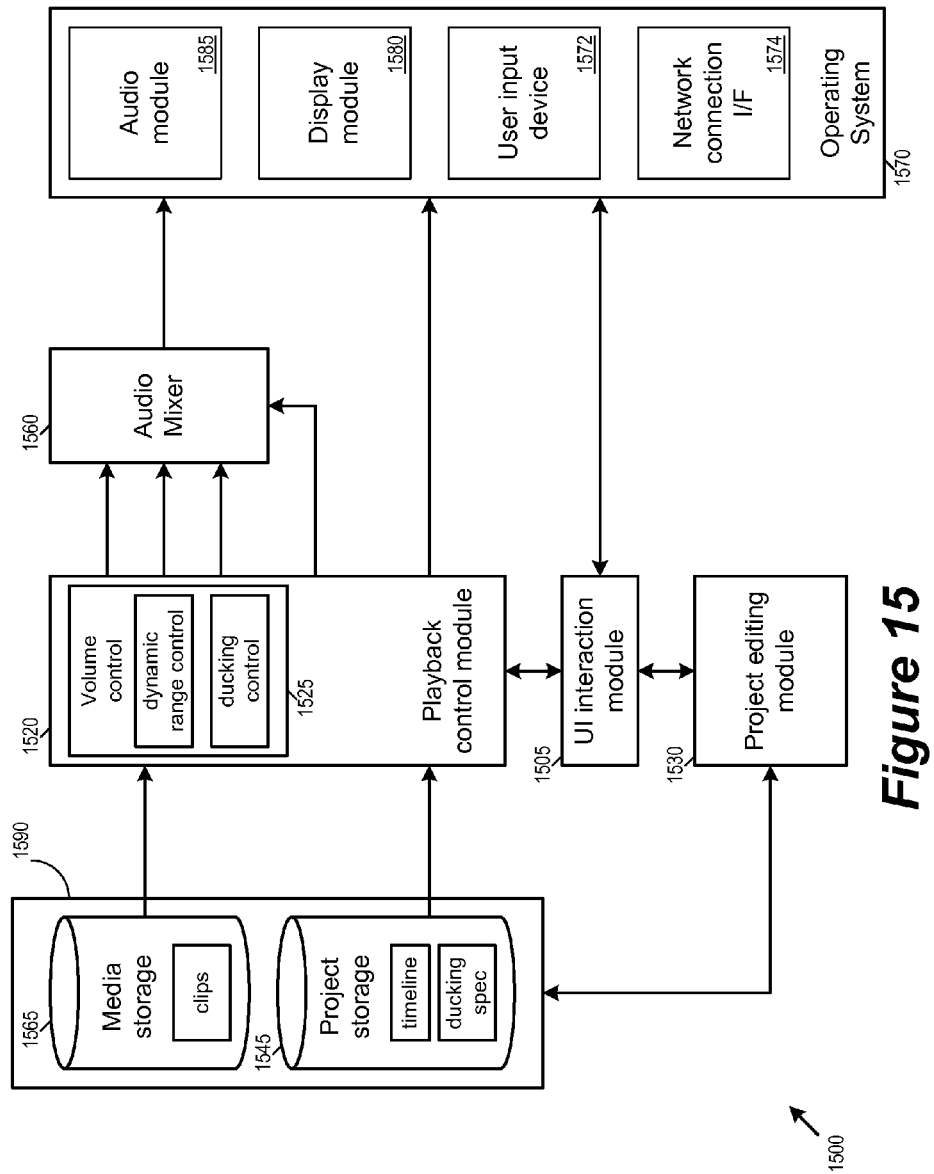
FIG. 15 conceptually illustrates the software architecture of a media editing application of some embodiments.

In some embodiments, the processes and operations described above are implemented as software running on a particular machine, such as a computer or a handheld device, or stored in a computer readable medium. FIG. 15 conceptually illustrates the software architecture of a media editing application 1500 of some embodiments. In some embodiments, the media editing application is a stand-alone application or is integrated into another application, while in other embodiments the application might be implemented within an operating system. Furthermore, in some embodiments, the application is provided as part of a server-based solution. In some of these embodiments, the application is provided via a thin client. That is, the application runs on a server while a user interacts with the application via a separate machine that is remote from the server. In other such embodiments, the application is provided via a thick client. That is, the application is distributed from the server to the client machine and runs on the client machine.

Media editing applications in different embodiments perform audio ducking operations differently. In some embodiments, the audio ducking parameters (e.g., master/slave designation and the required separation) that are set by the user of the media editing application are applied during the playback of the composite presentation. In some embodiments, the audio ducking parameters are stored along with the composite presentation and to be applied during future playback. In some embodiments, the media editing application outputs (to a speaker or a storage device) mixed audio with attenuated slave tracks based on the audio ducking parameters.

The media editing application 1500 includes a user interface (UI) interaction module 1505, a project editing module 1530, a playback control module 1520, and an audio mixer module 1560. The media editing application 1500 also includes a project storage 1545 and media storage 1565. In some embodiments, storages 1545 and 1565 are all stored in one physical storage 1590. In other embodiments, the storages are in separate physical storages.

FIG. 15 also illustrates an operating system 1570 that includes input device driver(s) 1572, a network connection interface(s) 1574, a display module 1580, and an audio module 1585. In some embodiments, as illustrated, the input device drivers 1572, the network connection interfaces 1574, the display module 1580 and the audio module 1585 are part of the operating system 1570, even when the media editing application 1500 is an application separate from the operating system.

The input device drivers 1572 may include drivers for translating signals from a keyboard, mouse, touchpad, drawing tablet, touchscreen, etc. A user interacts with one or more of these input devices, which send signals to their corresponding device driver. The device driver then translates the signals into user input data that is provided to the UI interaction module 1505.

The media editing application 1500 of some embodiments includes a graphical user interface that provides users with numerous ways to perform different sets of operations and functionalities. In some embodiments, these operations and functionalities are performed based on different commands that are received from users through different input devices (e.g., keyboard, trackpad, touchpad, mouse, etc.). For example, the present application illustrates the use of a cursor in the graphical user interface to control (e.g., select, move) objects in the graphical user interface. However, in some embodiments, objects in the graphical user interface can also be controlled or manipulated through other controls, such as touch control. In some embodiments, touch control is implemented through an input device that can detect the presence and location of touch on a display of the input device. An example of a device with such functionality is a touch screen device (e.g., as incorporated into a smart phone, a tablet computer, etc.). In some embodiments with touch control, a user directly manipulates objects by interacting with the graphical user interface that is displayed on the display of the touch screen device. For instance, a user can select a particular object in the graphical user interface by simply touching that particular object on the display of the touch screen device. As such, when touch control is utilized, a cursor may not even be provided for enabling selection of an object of a graphical user interface in some embodiments. However, when a cursor is provided in a graphical user interface, touch control can be used to control the cursor in some embodiments.

The display module 1580 translates the output of a user interface for a display device. That is, the display module 1580 receives signals (e.g., from the UI interaction module 1505) describing what should be displayed and translates these signals into pixel information that is sent to the display device. The display device may be an LCD, plasma screen, CRT monitor, touchscreen, etc. In some embodiments, the display module 1580 also receives signals from the playback control module 1520 for displaying video images from a composite presentation that the media editing application is composing.

The audio module 1585 receives digital audio signals from the audio mixer 1560 for a sound producing device that translates digital audio signals into actual sounds. The network connection interface 1574 enable the device on which the media editing application 1500 operates to communicate with other devices (e.g., a storage device located elsewhere in the network that stores the raw audio data) through one or more networks. The networks may include wireless voice and data networks such as GSM and UMTS, 802.11 networks, wired networks such as Ethernet connections, etc.

The UI interaction module 1505 of the media editing application 1500 interprets the user input data received from the input device drivers 1572 and passes it to various modules, including the project editing module 1530 and the playback control module 1520. The UI interaction module 1505 also manages the display of the UI, and outputs this display information to the display module 1580. This UI display information may be based on information from the playback control module 1520 or directly from the media storage 1565.

The project editing module 1530 is for creating and editing the composite presentation based on user input received from the UI interaction module 1505 and media content stored in the media storage 1565. The project editing module assembles media content from the media storage 1565 into a timelines of the composite presentation. The resulting composite presentation is then stored in the project storage 1545. In some embodiments, the project editing module receives user commands for specifying the parameters for audio ducking operations, including parameters such as the designation of master audio and the loudness separation between master and slave. The project editing module 1530 then saves these parameters into the project storage 1545 as part of the composite presentation.

The playback control module 1520 controls the playback of the composite presentation. In order to playback a composite presentation, the playback control module 1520 retrieves the project data and media content for the composite presentation from the project storage 1545 and media storage 1565. The playback control module also includes a volume control module 1525, which performs operations that affects the volume of the audio output, operations such as dynamic range control and audio ducking. The playback control module 1520 passes audio content from the media storage to the audio mixer 1560 according to the timing specified by the composite presentation. The audio mixer 1560 performs attenuation or amplification on individual tracks of the audio content before mixing the attenuated or amplified audio signals for output to the audio module 1585.

The attenuation/amplification are controlled by signals supplied by the volume control module 1525, which determines the attenuation or amplification needed according to the dynamic range control and/or the ducking control operations being performed.

While many of the features have been described as being performed by one module, one of ordinary skill in the art will recognize that the functions described herein might be split up into multiple modules. Similarly, functions described as being performed by multiple different modules might be performed by a single module in some embodiments. For example, the functions of the audio mixer module 1560 can be performed by one larger playback control module 1520.

V. Media Editing Application

Figure 16:
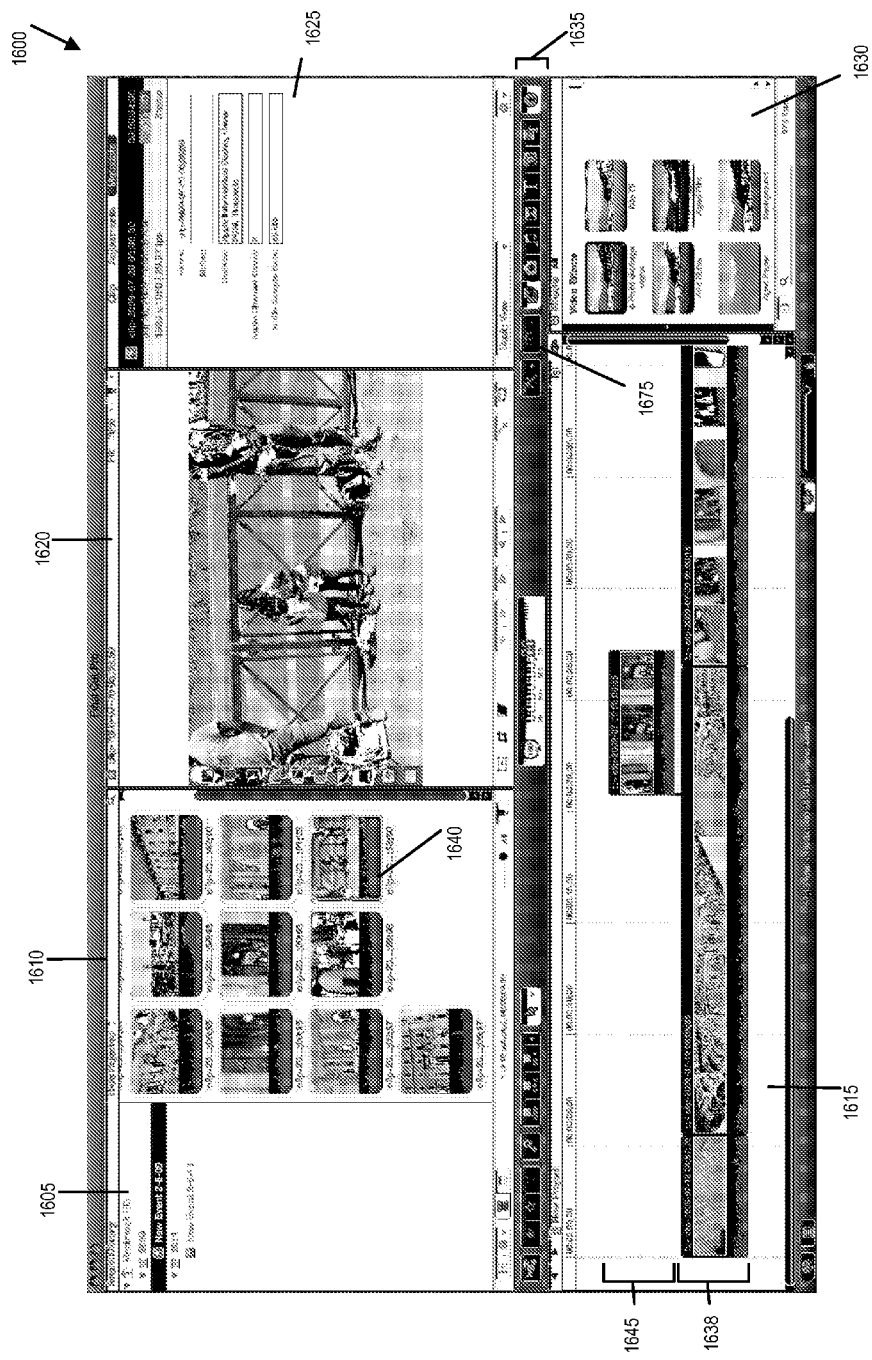
FIG. 16 illustrates a graphical user interface (GUI) of a media-editing application of some embodiments.

A more detailed view of a media editing application with features discussed above in Sections I-III is illustrated in FIG. 16. FIG. 16 illustrates a graphical user interface (GUI) 1600 of a media-editing application of some embodiments. One of ordinary skill will recognize that the graphical user interface 1600 is only one of many possible GUIs for such a media-editing application. In fact, the GUI 1600 includes several display areas which may be adjusted in size, opened or closed, replaced with other display areas, etc. The GUI 1600 includes a clip library 1605, a clip browser 1610, a timeline 1615, a preview display area 1620, an inspector display area 1625, an additional media display area 1630, and a toolbar 1635.

The clip library 1605 includes a set of folders through which a user accesses media clips that have been imported into the media-editing application. Some embodiments organize the media clips according to the device (e.g., physical storage device such as an internal or external hard drive, virtual storage device such as a hard drive partition, etc.) on which the media represented by the clips are stored. Some embodiments also enable the user to organize the media clips based on the date the media represented by the clips was created (e.g., recorded by a camera). As shown, the clip library 1605 includes media clips from both 2009 and 2011.

Within a storage device and/or date, users may group the media clips into "events", or organized folders of media clips. For instance, a user might give the events descriptive names that indicate what media is stored in the event (e.g., the "New Event 2-8-09" event shown in clip library 1605 might be renamed "European Vacation" as a descriptor of the content). In some embodiments, the media files corresponding to these clips are stored in a file storage structure that mirrors the folders shown in the clip library.

Within the clip library, some embodiments enable a user to perform various clip management actions. These clip management actions may include moving clips between events, creating new events, merging two events together, duplicating events (which, in some embodiments, creates a duplicate copy of the media to which the clips in the event correspond), deleting events, etc. In addition, some embodiments allow a user to create sub-folders of an event. These sub-folders may include media clips filtered based on tags (e.g., keyword tags). For instance, in the "New Event 2-8-09" event, all media clips showing children might be tagged by the user with a "kids" keyword, and then these particular media clips could be displayed in a sub-folder of the wedding event that filters clips in this event to only display media clips tagged with the "kids" keyword.

The clip browser 1610 allows the user to view clips from a selected folder (e.g., an event, a sub-folder, etc.) of the clip library 1605. As shown in this example, the folder "New Event 2-8-11 3" is selected in the clip library 1605, and the clips belonging to that folder are displayed in the clip browser 1610. Some embodiments display the clips as thumbnail filmstrips, as shown in this example. By moving a cursor (or a finger on a touchscreen) over one of the thumbnails (e.g., with a mouse, a touchpad, a touchscreen, etc.), the user can skim through the clip. That is, when the user places the cursor at a particular horizontal location within the thumbnail filmstrip, the media-editing application associates that horizontal location with a time in the associated media file, and displays the image from the media file for that time. In addition, the user can command the application to play back the media file in the thumbnail filmstrip.

In addition, the thumbnails for the clips in the browser display an audio waveform underneath the clip that represents the audio of the media file. In some embodiments, as a user skims through or plays back the thumbnail filmstrip, the audio plays as well.

Many of the features of the clip browser are user-modifiable. For instance, in some embodiments, the user can modify one or more of the thumbnail size, the percentage of the thumbnail occupied by the audio waveform, whether audio plays back when the user skims through the media files, etc. In addition, some embodiments enable the user to view the clips in the clip browser in a list view. In this view, the clips are presented as a list (e.g., with clip name, duration, etc.). Some embodiments also display a selected clip from the list in a filmstrip view at the top of the browser so that the user can skim through or playback the selected clip.

The timeline 1615 provides a visual representation of a composite presentation (or project) being created by the user of the media-editing application. Specifically, it displays one or more geometric shapes that represent one or more media clips that are part of the composite presentation. The timeline 1615 of some embodiments includes a primary lane 1638 (also called a "spine", "primary compositing lane", or "central compositing lane") as well as one or more secondary lanes 1645 (also called "anchor lanes"). The spine represents a primary sequence of media which, in some embodiments, does not have any gaps. The clips in the anchor lanes are anchored to a particular position along the spine (or along a different anchor lane). Anchor lanes may be used for compositing (e.g., removing portions of one video and showing a different video in those portions), B-roll cuts (i.e., cutting away from the primary video to a different video whose clip is in the anchor lane), audio clips, or other composite presentation techniques.

The user can add media clips from the clip browser 1610 into the timeline 1615 in order to add the clip to a presentation represented in the timeline. Within the timeline, the user can perform further edits to the media clips (e.g., move the clips around, split the clips, trim the clips, apply effects to the clips, etc.). The length (i.e., horizontal expanse) of a clip in the timeline is a function of the length of media represented by the clip. As the timeline is broken into increments of time, a media clip occupies a particular length of time in the timeline. As shown, in some embodiments the clips within the timeline are shown as a series of images. The number of images displayed for a clip varies depending on the length of the clip in the timeline, as well as the size of the clips (as the aspect ratio of each image will stay constant).

As with the clips in the clip browser, the user can skim through the timeline or play back the timeline (either a portion of the timeline or the entire timeline). In some embodiments, the playback (or skimming) is not shown in the timeline clips, but rather in the preview display area 1620.

The preview display area 1620 (also referred to as a "viewer") displays images from media files that the user is skimming through, playing back, or editing. These images may be from a composite presentation in the timeline 1615 or from a media clip in the clip browser 1610. In this example, the user has been skimming through the beginning of clip 1640, and therefore an image from the start of this media file is displayed in the preview display area 1620. As shown, some embodiments will display the images as large as possible within the display area while maintaining the aspect ratio of the image.

The inspector display area 1625 displays detailed properties about a selected item and allows a user to modify some or all of these properties. The selected item might be a clip, a composite presentation, an effect, etc. In this case, the clip that is shown in the preview display area 1620 is also selected, and thus the inspector displays information about media clip 1640. This information includes duration, file format, file location, frame rate, date created, audio information, etc. about the selected media clip. In some embodiments, different information is displayed depending on the type of item selected.

The additional media display area 1630 displays various types of additional media, such as video effects, transitions, still images, titles, audio effects, standard audio clips, etc. In some embodiments, the set of effects is represented by a set of selectable UI items, each selectable UI item representing a particular effect. In some embodiments, each selectable UI item also includes a thumbnail image with the particular effect applied. The display area 1630 is currently displaying a set of effects for the user to apply to a clip. In this example, only two effects are shown in the display area (the keyer effect and the luma keyer effect, because the user has typed the word "keyer" into a search box for the effects display area).

The toolbar 1635 includes various selectable items for editing, modifying what is displayed in one or more display areas, etc. The right side of the toolbar includes various selectable items for modifying what type of media is displayed in the additional media display area 1630. The illustrated toolbar 1635 includes items for video effects, visual transitions between media clips, photos, titles, generators and backgrounds, etc. The left side of the toolbar 1635 includes selectable items for media management and editing. Selectable items are provided for adding clips from the clip browser 1610 to the timeline 1615. In some embodiments, different selectable items may be used to add a clip to the end of the spine, add a clip at a selected point in the spine (e.g., at the location of a playhead), add an anchored clip at the selected point, perform various trim operations on the media clips in the timeline, etc. The media management tools of some embodiments allow a user to mark selected clips as favorites, among other options.

One or ordinary skill will also recognize that the set of display areas shown in the GUI 1600 is one of many possible configurations for the GUI of some embodiments. For instance, in some embodiments, the presence or absence of many of the display areas can be toggled through the GUI (e.g., the inspector display area 1625, additional media display area 1630, and clip library 1605). In addition, some embodiments allow the user to modify the size of the various display areas within the UI. For instance, when the additional media display area 1630 is removed, the timeline 1615 can increase in size to include that area. Similarly, the preview display area 1620 increases in size when the inspector display area 1625 is removed.

VI. Electronic System

Many of the above-described features and applications are implemented as software processes that are specified as a set of instructions recorded on a computer readable storage medium (also referred to as computer readable medium). When these instructions are executed by one or more computational or processing unit(s) (e.g., one or more processors, cores of processors, or other processing units), they cause the processing unit(s) to perform the actions indicated in the instructions. Examples of computer readable media include, but are not limited to, CD-ROMs, flash drives, random access memory (RAM) chips, hard drives, erasable programmable read only memories (EPROMs), electrically erasable programmable read-only memories (EEPROMs), etc. The computer readable media does not include carrier waves and electronic signals passing wirelessly or over wired connections.

In this specification, the term "software" is meant to include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 17:
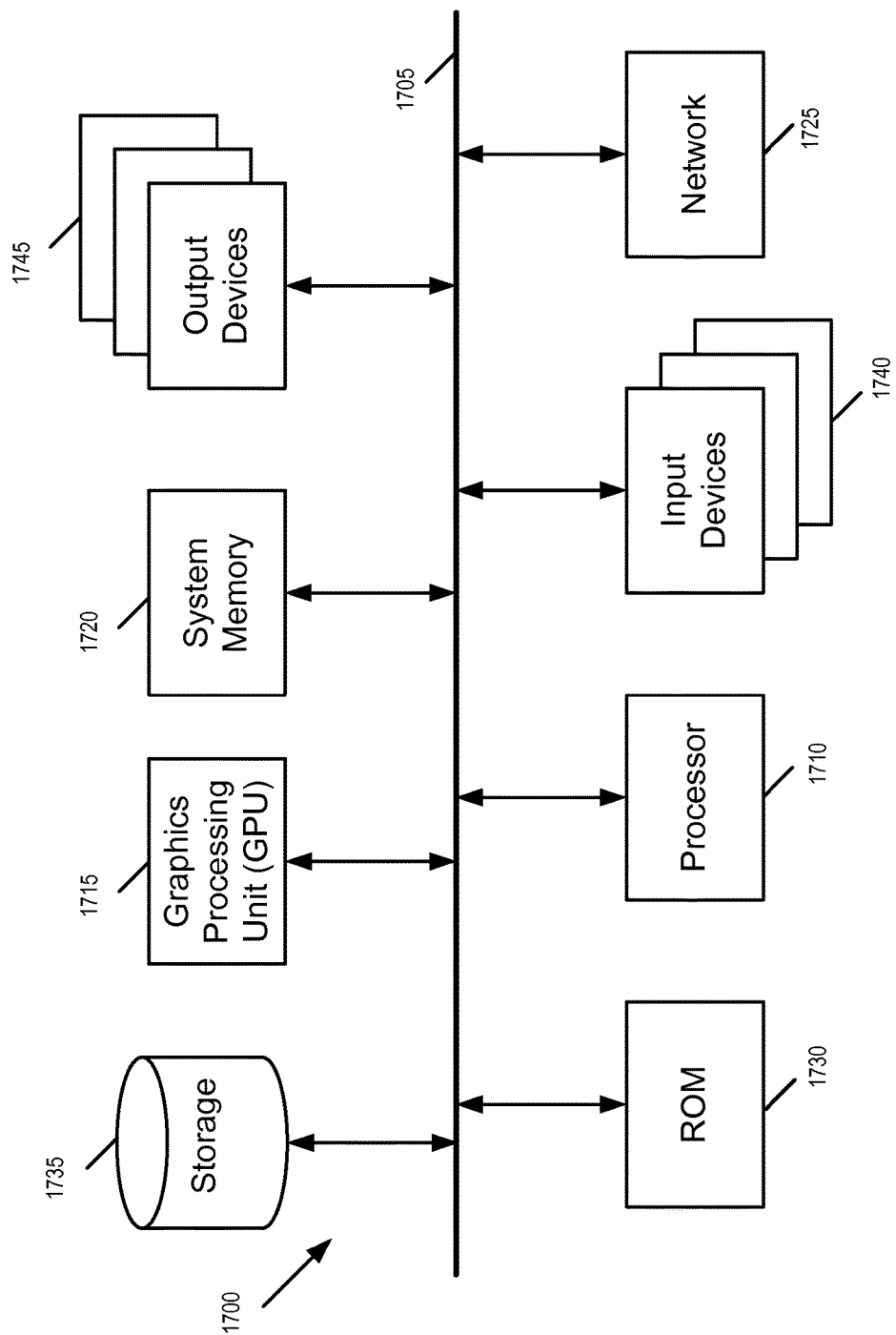
FIG. 17 conceptually illustrates an electronic system with which some embodiments of the invention are implemented.

FIG. 17 conceptually illustrates an electronic system 1700 with which some embodiments of the invention are implemented. The electronic system 1700 may be a computer (e.g., a desktop computer, personal computer, tablet computer, etc.), phone, PDA, or any other sort of electronic device. Such an electronic system includes various types of computer readable media and interfaces for various other types of computer readable media. Electronic system 1700 includes a bus 1705, processing unit(s) 1710, a graphics processing unit (GPU) 1715, a system memory 1720, a network 1725, a read-only memory 1730, a permanent storage device 1735, input devices 1740, and output devices 1745.

The bus 1705 collectively represents all system, peripheral, and chipset buses that communicatively connect the numerous internal devices of the electronic system 1700. For instance, the bus 1705 communicatively connects the processing unit(s) 1710 with the read-only memory 1730, the GPU 1715, the system memory 1720, and the permanent storage device 1735.

From these various memory units, the processing unit(s) 1710 retrieves instructions to execute and data to process in order to execute the processes of the invention. The processing unit(s) may be a single processor or a multi-core processor in different embodiments. Some instructions are passed to and executed by the GPU 1715. The GPU 1715 can offload various computations or complement the image processing provided by the processing unit(s) 1710. In some embodiments, such functionality can be provided using CoreImage's kernel shading language.

The read-only-memory (ROM) 1730 stores static data and instructions that are needed by the processing unit(s) 1710 and other modules of the electronic system. The permanent storage device 1735, on the other hand, is a read-and-write memory device. This device is a non-volatile memory unit that stores instructions and data even when the electronic system 1700 is off. Some embodiments of the invention use a mass-storage device (such as a magnetic or optical disk and its corresponding disk drive) as the permanent storage device 1735.

Other embodiments use a removable storage device (such as a floppy disk, flash memory device, etc., and its corresponding disk drive) as the permanent storage device. Like the permanent storage device 1735, the system memory 1720 is a read-and-write memory device. However, unlike storage device 1735, the system memory 1720 is a volatile read-and-write memory, such a random access memory. The system memory 1720 stores some of the instructions and data that the processor needs at runtime. In some embodiments, the invention's processes are stored in the system memory 1720, the permanent storage device 1735, and/or the read-only memory 1730. For example, the various memory units include instructions for processing multimedia clips in accordance with some embodiments. From these various memory units, the processing unit(s) 1710 retrieves instructions to execute and data to process in order to execute the processes of some embodiments.

The bus 1705 also connects to the input and output devices 1740 and 1745. The input devices 1740 enable the user to communicate information and select commands to the electronic system. The input devices 1740 include alphanumeric keyboards and pointing devices (also called "cursor control devices"), cameras (e.g., webcams), microphones or similar devices for receiving voice commands, etc. The output devices 1745 display images generated by the electronic system or otherwise output data. The output devices 1745 include printers and display devices, such as cathode ray tubes (CRT) or liquid crystal displays (LCD), as well as speakers or similar audio output devices. Some embodiments include devices such as a touchscreen that function as both input and output devices.

Finally, as shown in FIG. 17, bus 1705 also couples electronic system 1700 to a network 1725 through a network adapter (not shown). In this manner, the computer can be a part of a network of computers (such as a local area network ("LAN"), a wide area network ("WAN"), or an Intranet, or a network of networks, such as the Internet. Any or all components of electronic system 1700 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, read-only and recordable Blu-Ray® discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself. In addition, some embodiments execute software stored in programmable logic devices (PLDs), ROM, or RAM devices.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium," "computer readable media," and "machine readable medium" are entirely restricted to tangible, physical objects that store information in a form that is readable by a computer. These terms exclude any wireless signals, wired download signals, and any other ephemeral signals.

While the invention has been described with reference to numerous specific details, one of ordinary skill in the art will recognize that the invention can be embodied in other specific forms without departing from the spirit of the invention. In addition, a number of the figures (including FIG. 11) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

What is claimed is:

1. A method of creating multimedia presentations, the method comprising:
   creating a composite presentation that comprises a plurality of audio clips;
   specifying a minimum loudness separation between a first audio clip and a second audio clip of the plurality of audio clips; and
   playing back the composite presentation, wherein playing back the composite presentation comprises reducing the loudness of the first audio clip to meet the specified minimum loudness separation between the first audio clip and the second audio clip.

2. The method of claim 1, wherein reducing the loudness of the first audio clip comprises performing an audio ducking operation that uses the first audio clip as a slave track and the second audio clip as a master track.

3. The method of claim 1, wherein the loudness of the first audio clip is reduced when the second audio clip is not silent.

4. The method of claim 1 further comprising specifying that the second audio clip is a master audio for an audio ducking operation.

5. The method of claim 1 further comprising identifying a worst case differential between the first audio clip and the second audio clip over a window of time, wherein reducing the loudness of the first audio clip is further based on the identified worst case differential.

6. The method of claim 5 further comprising limiting the worst case differential based on a program loudness of the first audio clip and a program loudness of the second audio clip.

7. A non-transitory computer readable medium storing a program which when executed by at least one processing unit creates multimedia presentations, the program comprising sets of instructions for:
   creating a composite presentation that comprises a plurality of audio clips;
   specifying a minimum loudness separation between a first audio clip and a second audio clip of the plurality of audio clips; and
   playing back the composite presentation, wherein the set of instructions for playing back the composite presentation comprises a set of instructions for reducing the loudness of the first audio clip to meet the specified minimum loudness separation between the first audio clip and the second audio clip.

8. The non-transitory computer readable medium of claim 7, wherein the set of instructions for reducing the loudness of the first audio clip comprises a set of instructions for performing an audio ducking operation that uses the first audio clip as a slave track and the second audio clip as a master track.

9. The non-transitory computer readable medium of claim 7, wherein the loudness of the first audio clip is reduced when the second audio clip is not silent.

10. The non-transitory computer readable medium of claim 7, wherein the program further comprises a set of instructions for specifying that the second audio clip is a master audio for an audio ducking operation.

11. The non-transitory computer readable medium of claim 7, wherein the program further comprises sets of instructions for:
    specifying a set of minimum loudness separations between a plurality of audio clips and the second audio clip; and
    reducing the loudness of the plurality of audio clips based on the set of minimum loudness separations to provide the minimum loudness separation between each of the plurality of audio clips and the second audio clip.

12. The non-transitory computer readable medium of claim 11, wherein a first minimum loudness separation and a second minimum loudness separation in the set of minimum loudness separations are not the same.

13. The non-transitory computer readable medium of claim 11, wherein the set of relative loudness separations specifies a distribution of a total loudness energy among the plurality of audio clips.

14. A media editing system for creating multimedia presentations comprising:
    a set of processing units; and
    a non-transitory computer readable medium storing a program which when executed by at least one processing unit creates multimedia presentations, the program comprising sets of instructions for:
      creating a composite presentation that comprises a plurality of audio clips;
      specifying a minimum loudness separation between a first audio clip and a second audio clip of the plurality of audio clips; and
      playing back the composite presentation, wherein the set of instructions for playing back the composite presentation comprises a set of instructions for reducing the loudness of the first audio clip to meet the specified minimum loudness separation between the first audio clip and the second audio clip.

15. The media editing system of claim 14, wherein the program further comprises a set of instructions for generating a plurality of attenuation control signals for the plurality of audio clips, wherein a first attenuation control signal is for reducing a loudness of the first audio clip based on the minimum loudness separation between the first audio clip and the second audio clip.

16. The media editing system of claim 15, wherein the media editing system further comprises a plurality of attenuators for attenuating the plurality of audio clips based on the plurality of attenuation control signals to reduce the loudness of the plurality of audio clips.

17. The media editing system of claim 14, wherein the loudness of the first audio clip is reduced when the second audio clip is not silent.

18. The media editing system of claim 14, wherein the program further comprises a set of instructions for specifying that the second audio clip is a master audio for an audio ducking operation.

19. The media editing system of claim 14, wherein the program further comprises a set of instructions for identifying a worst case differential between the first audio clip and the second audio clip over a window of time, wherein the set of instructions for reducing the loudness of the first audio clip further comprises a set of instructions for reducing the loudness of the first audio clip based on the identified worst case differential.

20. The media editing system of claim 19, wherein the program further comprises a set of instructions for limiting the worst case differential based on a program loudness of the first audio clip and a program loudness of the second audio clip.

* * * * *